US008782350B2

(12) United States Patent
Lee et al.

(10) Patent No.: US 8,782,350 B2
(45) Date of Patent: Jul. 15, 2014

(54) CIRCUIT PROVIDING LOAD ISOLATION AND NOISE REDUCTION

(75) Inventors: Hyun Lee, Ladera Ranch, CA (US); Jayesh R. Bhakta, Cerritos, CA (US); Jeffrey C. Solomon, Irvine, CA (US); Mario Jesus Martinez, Laguna Niguel, CA (US); Chi-She Chen, Walnut, CA (US)

(73) Assignee: Netlist, Inc., Irvine, CA (US)

( * ) Notice: Subject to any disclaimer, the term of this patent is extended or adjusted under 35 U.S.C. 154(b) by 206 days.

(21) Appl. No.: 13/412,243

(22) Filed: Mar. 5, 2012

(65) Prior Publication Data

US 2012/0250386 A1 Oct. 4, 2012

Related U.S. Application Data

(63) Continuation of application No. 12/422,853, filed on Apr. 13, 2009, now Pat. No. 8,154,901.

(60) Provisional application No. 61/044,839, filed on Apr. 14, 2008, provisional application No. 61/044,825, filed on Apr. 14, 2008, provisional application No. 61/044,801, filed on Apr. 14, 2008.

(51) Int. Cl.
*G06F 12/00* (2006.01)
*H05K 1/02* (2006.01)

(52) U.S. Cl.
CPC .... *H05K 1/0243* (2013.01); *H05K 2201/10053* (2013.01); *H05K 2201/10189* (2013.01); *H05K 2201/10159* (2013.01); *H05K 1/0216* (2013.01)
USPC ............................ 711/149; 365/191; 365/195

(58) Field of Classification Search
USPC .................................. 711/149; 365/191, 196
See application file for complete search history.

(56) References Cited

U.S. PATENT DOCUMENTS 3,660,675 A 5/1972 Andrews, Jr.
3,757,235 A 9/1973 McCormick et al.

(Continued)

FOREIGN PATENT DOCUMENTS

EP 1 816 570 A2 8/2007
JP 09237492 9/1997

(Continued)

OTHER PUBLICATIONS

Der-Chang et al. "*A parallel built-in self-diagnostic method for embedded memoryarrays*", IEEE Transactions on Computer-Aided Design of Integrated Circuits and Systems, Apr. 2002, vol. 21, Issue 4, pp. 449-465.

(Continued)

*Primary Examiner* — Gurtej Bansal
(74) *Attorney, Agent, or Firm* — Jamie J. Zheng, Esq.

(57) ABSTRACT

Certain embodiments described herein include a memory module having a printed circuit board including at least one connector configured to be operatively coupled to a memory controller of a computer system. The memory module further includes a plurality of memory devices on the printed circuit board and a circuit including a first set of ports operatively coupled to at least one memory device. The circuit further includes a second set of ports operatively coupled to the at least one connector. The circuit includes a switching circuit configured to selectively operatively couple one or more ports of the second set of ports to one or more ports of the first set of ports. Each port of the first set and the second set comprises a correction circuit which reduces noise in one or more signals transmitted between the first set of ports and the second set of ports.

20 Claims, 9 Drawing Sheets

(56) References Cited

U.S. PATENT DOCUMENTS 4,249,253 A 2/1981 Gentili et al.
4,305,091 A 12/1981 Cooper
4,368,515 A 1/1983 Nielsen
4,571,676 A 2/1986 Mantellina et al.
4,586,168 A 4/1986 Adlhoch et al.
4,592,011 A 5/1986 Mantellina et al.
4,701,845 A 10/1987 Andreasen et al.
4,752,741 A 6/1988 Kim et al.
4,782,487 A 11/1988 Smelser
4,837,743 A 6/1989 Chiu et al.
4,885,799 A 12/1989 Van Horn
4,903,266 A 2/1990 Hack
4,910,597 A 3/1990 Harada et al.
4,942,556 A 7/1990 Sasaki et al.
4,987,321 A 1/1991 Toohey
5,060,188 A 10/1991 Zulian et al.
5,138,619 A 8/1992 Fasang et al.
5,173,906 A 12/1992 Dreibelbis et al.
5,222,066 A 6/1993 Grula et al.
5,241,503 A 8/1993 Cheng
5,304,856 A 4/1994 Rainal
5,337,254 A 8/1994 Knee et al.
5,345,412 A 9/1994 Shiratsuchi
5,359,235 A 10/1994 Coyle et al.
5,394,037 A 2/1995 Josephson et al.
5,430,335 A 7/1995 Tanoi
5,463,590 A 10/1995 Watanabe
5,513,135 A 4/1996 Dell et al.
5,525,917 A 6/1996 Wong et al.
5,532,954 A 7/1996 Bechtolsheim et al.
5,537,584 A 7/1996 Miyai et al.
5,541,448 A 7/1996 Carpenter
5,572,691 A 11/1996 Koudmani
5,581,498 A 12/1996 Ludwig
5,590,071 A 12/1996 Kolor
5,617,559 A 4/1997 Le et al.
5,649,159 A 7/1997 Le et al.
5,717,851 A 2/1998 Yishay et al.
5,724,604 A 3/1998 Moyer
5,729,716 A 3/1998 Lee et al.
5,745,914 A 4/1998 Connolly
5,784,705 A 7/1998 Leung
5,802,395 A 9/1998 Connolly
5,802,541 A 9/1998 Reed
5,841,296 A 11/1998 Churcher et al.
RE36,229 E 6/1999 Cady
5,914,543 A 6/1999 Scherpenberg et al.
5,926,827 A 7/1999 Dell
5,953,280 A 9/1999 Watsui
5,973,392 A 10/1999 Senba et al.
6,000,048 A 12/1999 Krishna et al.
6,044,481 A 3/2000 Kornachuk et al.
6,070,217 A 5/2000 Connolly et al.
6,169,696 B1 1/2001 Bissey
6,173,357 B1 1/2001 Ju
6,188,641 B1 2/2001 Uchida
6,194,959 B1 2/2001 Kamoshida et al.
6,205,516 B1 3/2001 Usami
6,209,074 B1 3/2001 Dell
6,216,240 B1 4/2001 Won et al.
6,233,650 B1 5/2001 Johnson
6,260,127 B1 7/2001 Olarig et al.
6,414,868 B1 7/2002 Wong
6,438,062 B1 8/2002 Curtis
6,446,158 B1 9/2002 Karabatsos
6,446,184 B2 9/2002 Dell
6,467,056 B1 10/2002 Satou et al.
6,480,439 B2 11/2002 Tokutome et al.
6,553,449 B1 4/2003 Dodd et al.
6,560,740 B1 5/2003 Zuraski, Jr. et al.
6,614,702 B2 9/2003 Lee
6,618,791 B1 9/2003 Dodd et al.
6,717,855 B2 4/2004 Underwood
6,721,150 B1 4/2004 Guerrero, Jr.
6,788,592 B2 9/2004 Nakata et al.
6,812,869 B1 11/2004 Rahman et al.
6,829,728 B2 12/2004 Cheng et al.
6,918,072 B2 7/2005 Cowles et al.
6,928,024 B2 8/2005 Pfeiffer et al.
6,928,593 B1 8/2005 Halbert et al.
6,930,509 B2 8/2005 Banik
6,934,900 B1 8/2005 Cheng et al.
6,948,084 B1 9/2005 Manapat et al.
7,036,064 B1 4/2006 Kebichi et al.
7,053,470 B1 5/2006 Sellers et al.
7,062,696 B2 6/2006 Barry et al.
7,130,308 B2 * 10/2006 Haddock et al. .............. 370/423
7,133,960 B1 11/2006 Thompson et al.
7,184,915 B2 2/2007 Hansquine et al.
7,190,210 B2 3/2007 Azrai et al.
7,203,873 B1 4/2007 Adams
7,253,652 B2 8/2007 Azimi et al.
7,284,166 B2 10/2007 Zappa et al.
7,289,386 B2 10/2007 Bhakta et al.
7,379,361 B2 5/2008 Co et al.
7,532,537 B2 5/2009 Solomon et al.
7,619,912 B2 11/2009 Bhakta et al.
7,636,274 B2 12/2009 Solomon et al.
7,864,627 B2 1/2011 Bhakta et al.
7,881,150 B2 2/2011 Solomon et al.
7,916,574 B1 3/2011 Solomon et al.
8,001,434 B1 8/2011 Lee et al.
8,130,560 B1 3/2012 Rajan
8,250,295 B2 8/2012 Amidi et al.
8,516,188 B1 8/2013 Solomon et al.
2001/0048342 A1 12/2001 Yoshida et al.
2002/0000847 A1 1/2002 Taguchi
2002/0048195 A1 4/2002 Klein
2002/0131535 A1 9/2002 Huber
2002/0140523 A1 10/2002 Park et al.
2003/0070052 A1 4/2003 Lai
2003/0098742 A1 5/2003 Nakagawa et al.
2003/0126346 A1 7/2003 Kuo
2003/0197797 A1 10/2003 Segura
2003/0218491 A1 11/2003 Nagasue
2004/0098528 A1 5/2004 Janzen
2004/0155702 A1 8/2004 Danielsson
2004/0199843 A1 10/2004 Hansquine et al.
2005/0010737 A1 1/2005 Ware et al.
2005/0093620 A1 5/2005 Ho et al.
2005/0127989 A1 6/2005 Miyagi
2005/0289423 A1 12/2005 Yabuta
2006/0082383 A1 4/2006 Choi
2006/0107156 A1 5/2006 Lee et al.
2006/0117152 A1 6/2006 Amidi
2006/0140015 A1 6/2006 Kasamsetty
2006/0144015 A1 7/2006 Cash et al.
2006/0147217 A1 7/2006 Hahin et al.
2006/0192653 A1 8/2006 Atkinson et al.
2006/0233012 A1 10/2006 Sekiguchi et al.
2006/0242458 A1 10/2006 Feldman et al.
2006/0262586 A1 11/2006 Solomon et al.
2006/0271748 A1 11/2006 Jain et al.
2007/0030814 A1 2/2007 Shin et al.
2007/0058409 A1 3/2007 Ruckerbauer et al.
2007/0058471 A1 3/2007 Rajan et al.
2007/0079199 A1 4/2007 Chorn et al.
2007/0109707 A1 5/2007 Honda
2007/0152743 A1 7/2007 Keeth et al.
2007/0204075 A1 8/2007 Rajan et al.
2007/0223296 A1 9/2007 Miller et al.
2007/0293094 A1 * 12/2007 Aekins .......................... 439/676
2008/0025137 A1 1/2008 Rajan et al.
2008/0046631 A1 2/2008 Takaku et al.
2008/0162790 A1 7/2008 Im
2009/0103387 A1 4/2009 Shau
2010/0070690 A1 3/2010 Amer et al.
2010/0091540 A1 4/2010 Bhakta et al.
2011/0090749 A1 4/2011 Bhakta et al.
2011/0125966 A1 5/2011 Amidi et al.

(56) References Cited

U.S. PATENT DOCUMENTS

FOREIGN PATENT DOCUMENTS

| | | | |
|---|---|---|---|
| JP | H10092169 | A | 9/1997 |
| JP | 10320270 | | 12/1998 |
| JP | 2000285674 | | 10/2000 |
| JP | 2000311485 | A | 10/2000 |
| JP | 2002184176 | | 6/2002 |
| JP | 2003007963 | | 1/2003 |
| JP | 2008046989 | | 2/2008 |

OTHER PUBLICATIONS

Bayard "On the LTI properties of adaptive feed forward systems with tapdelay-line regressors", IEEE Transactions on Signal Processing, May 1999, vol. 47, Issue 5, pp. 1288-1296.
Mutoh et al. "EMI Noise controlling methods suitable for electric vehicle drive systems", Industrial Electronics Society, 2004, IECON 2004, Nov. 2-6, 2004, vol. 1, pp. 963-968.
Sekiguchi et al "Low-noise, high-speed datat transmission using a ringing-canceling output buffer", IEEE Journal of Solid-State Circuits, Dec. 1995, vol. 30, Issue 12, pp. 1569-1574.
U.S. Appl. No. 95/000,578, filed Oct. 20, 2010, Netlist, Inc.
U.S. Appl. No. 95/000,579, filed Oct. 21, 2010, Netlist, Inc.
U.S. Appl. No. 95/001,338, Not available, Netlist, Inc.
U.S. Appl. No. 95/001,758, filed Sep. 14, 2011, Netlist, Inc.
U.S. Appl. No. 11/075,395, filed Mar. 7, 2005, Netlist, Inc.
U.S. Appl. No. 11/142,989, filed Dec. 7, 2006, Netlist, Inc.
U.S. Appl. No. 11/173,175, filed Jul. 1, 2005, Netlist, Inc.
U.S. Appl. No. 11/335,875, filed Jan. 19, 2006, Netlist, Inc.
U.S. Appl. No. 11/862,931, filed Sep. 27, 2007, Netlist, Inc.
U.S. Appl. No. 12/408,652, filed Mar. 20, 2009, Netlist, Inc.
U.S. Appl. No. 12/422,853, filed Apr. 13, 2009, Netlist, Inc.
U.S. Appl. No. 12/422,925, filed Apr. 13, 2009, Netlist, Inc.
U.S. Appl. No. 12/504,131, filed Jul. 16, 2009, Netlist, Inc.
U.S. Appl. No. 12/577,682, filed Oct. 12, 2009, Netlist, Inc.
U.S. Appl. No. 12/629,827, filed Dec. 2, 2009, Netlist, Inc.
U.S. Appl. No. 12/761,179, filed Apr. 15, 2010, Netlist, Inc.
U.S. Appl. No. 12/902,073, filed Oct. 11, 2010, Netlist, Inc.
U.S. Appl. No. 12/912,623, filed Oct. 26, 2010, Netlist, Inc.
U.S. Appl. No. 12/954,492, filed Nov. 24, 2010, Netlist, Inc.
U.S. Appl. No. 12/955,711, filed Nov. 29, 2010, Netlist, Inc.
U.S. Appl. No. 12/981,380, filed Dec. 29, 2010, Netlist, Inc.
U.S. Appl. No. 13/032,470, filed Feb. 22, 2011, Netlist, Inc.
U.S. Appl. No. 13/154,172, filed Jun. 6, 2011, Netlist, Inc.
U.S. Appl. No. 13/183,253, filed Jul. 14, 2011, Netlist, Inc.
U.S. Appl. No. 13/287,042, filed Nov. 1, 2011, Netlist, Inc.
U.S. Appl. No. 13/287,081, filed Nov. 1, 2011, Netlist, Inc.
U.S. Appl. No. 13/288,850, filed Nov. 3, 2011, Netlist, Inc.
U.S. Appl. No. 13/411,344, filed Mar. 2, 2012, Netlist, Inc.
U.S. Appl. No. 13/412,243, filed Mar. 5, 2012, Netlist, Inc.
U.S. Appl. No. 13/473,413, filed May 16, 2012, Netlist, Inc.
U.S. Appl. No. 13/745,790, filed Jan. 19, 2013, Netlist, Inc.
U.S. Appl. No. 13/952,599, filed Jul. 27, 2013, Netlist, Inc.
U.S. Appl. No. 13/970,606, filed Aug. 20, 2013, Netlist, Inc.
U.S. Appl. No. 13/971,231, filed Aug. 20, 2013, Netlist, Inc.
U.S. Appl. No. 14/229,844, filed Mar. 29, 2014, Netlist, Inc.
Anonymous. (Dec. 1996). "Applications Note: Understanding DRAM Operation," IBM, 10 pages.
Behrens, S. "HP Printer Memory Explained", The ZonkPage, Last Updated Jan. 21, 2004. Accessed Feb. 10, 2013, Retrieved from the Internet: URL <http://warshaft.com/hpmem.htm>. 7pp.
Non-Final Office Action, U.S. Appl. No. 13/412,243, Jan. 2, 2014, 20 pages.
Non-final office action, U.S. Appl. No. 13/288,850, Oct. 11, 2013, 24 pages.
Non-final office action, U.S. Appl. No. 13/411,413, Dec. 31, 2013, 28 pages.
Non-final office action, U.S. Appl. No. 13/473,413, Nov. 17, 2011, 46 pages.
Response to non-final office action dated Oct. 14, 2013 for U.S. Appl. No. 13/288,850, filed Jan. 13, 2014, 15 pages.
Response to non-final office action dated Dec. 31, 2013 for U.S. Appl. No. 13/411,344, filed Mar. 31, 2014, 12 pages.
Patent Owner's Response to Office Action mailed Nov. 13, 2012 for Reexamination Control Nos. 95/000,578; 95/000,579, and 95/001,339, filed Jan. 14, 2013, 96 pages.
Patent Owner's Response to Office Action mailed Dec. 19, 2012 for Reexamination Control No. 95/001,758, filed Mar. 19, 2013, 61 pages.
Patent Owner's Response to Office Action mailed Sep. 26, 2013 for Reexamination Control No. 95/001,758, filed Nov. 26, 2013, 85 pages.
Third Party Requester's Comments after Non-Final Action mailed Sep. 26, 2013 for Reexamination Control No. 95/001758.
Patent Owner's Appeal Brief for Reexamination Control Nos. 95/000,546 and 95/000,577, filed Oct. 2, 2013, 46 pages.
Patent Trial and Appeal Board Decision on Appeal for Reexamination Control No. 95/001/337, mailed Jan. 16, 2014, 30 pages.
Patent Trial and Appeal Board Decision on Appeal for Reexamination Control No. 95/001/381, mailed Jan. 16, 2014, 24 pages.
Action Closing Prosecution mailed Mar. 27, 2014 for Reexamination Control No. 95/001,758, filed Sep. 14, 2011, 40 pages.
Action Closing Prosecution mailed Mar. 27, 2014 for Reexamination Control No. 95/001,339, filed Jun. 8, 2010, 106 pages.
Notice of Allowance, U.S. Appl. No. 12/504,131, Feb. 12, 2013, 52 pages.
Non-Final Office Action, dated Jan. 2, 2014, for U.S. Appl. No. 13/287,042, filed Nov. 1, 2011, 42 pages.
Response to Non-Final Office Action dated Jan. 2, 2014, filed Apr. 2, 2004, for U.S. Appl. No. 13/287,042, filed Nov. 1, 2011, 12 pages.
Office Action mailed Apr. 2, 2014, for Japanese Patent Application No. 2012-520662 and English translation thereof, 7 pages.
Non-Final Office Action mailed Mar. 23, 2012, for U.S. Appl. No. 12/761,179, filed Apr. 15, 2010, 33 pages.
Response filed Jun. 21, 2012 to Non-Final Office Action mailed Mar. 23, 2012, for U.S. Appl. No. 12/761,179, filed Apr. 15, 2010, 11 pages.
Non-Final Office Action mailed Sep. 13, 2012, for U.S. Appl. No. 12/761,179, filed Apr. 15, 2010, 20 pages.
Response to non-final office action dated Sep. 13, 2012 for U.S. Appl. No. 12/761,179, filed Mar. 13, 2013, 16 pages.
Notice of Allowance, U.S. Appl. No. 12/761,179, Jul. 11, 2013, 37 pages.
International Search Report and Written Opinion, PCT/US2011/059209, Jan. 31, 2013.
Action Closing Prosecution mailed Oct. 1, 2012, for Control Nos. 95/000,546 and 95/000,577, filed May 11, 2010 and Oct. 20, 2010 respectively, 39 pages.
Non-Final Office Action mailed Nov. 13, 2012, for Control Nos. 95/001,339, 95/000,578 and 95/000,579, filed Apr. 20, 2010, Oct. 20, 2010 and Oct. 21, 2010 respectively, 81 pages.
Order Granting Request for Inter Partes Reexamination and Non-Final Office Action mailed Dec. 7, 2012, for Control No. 95/002, 399, filed Sep. 15, 2012, 89 pages.
Non-Final Office Action mailed Dec. 19, 2012, for Control No. 95/001,758, filed Sep. 14, 2011, 36 pages.
Request for Inter Partes Reexamination; Reexam U.S. Appl. No. 95/001,758, for U.S. Patent No. 7,864,627, filed Sep. 15, 2011, 814 pages (submitted in four parts.).
Request for Inter Partes Reexamination; Reexam U.S. Appl. No. 95/001,381 for U.S. Pat. No. 7,532,537; filed Jun. 9, 2010, 247pages; Owned by Netlist, Inc. And Its Entire Prosecution.
Anonymous. (May 2002). "Hynix HYMD512G726(L)8-K/H/L Registered DDR SDRAM DIMM, 128M×72 bits Product Description," Rev. 0.1/May 2, pp. 1-16.
"Elipida Memory to Speak at Intel's Memory Implementers Forum Roundtable Event", Intel Developer Forum, [Online]. Retrieved from the Internet: <URSL: http://www.elpida.com/en/news/2004/02-18.html>, (Jun. 14, 2011), 1 pg.
*Google, Inc.* v. *Netlist, Inc.*, No. 4:08-cv-04144-SBA, Netlist Inc.'s Answer to Complaint and Counterclaim (N.D. Ca. Filed Nov. 18, 2008).

(56) References Cited

OTHER PUBLICATIONS

*Google, Inc.* v. *Netlist, Inc.*, No. C 08-04144 SBA Google Inc.'s Invalidity Contentions Pursuant to PAT. L.F. 3-3, dated Apr. 13, 2009.
*Google, Inc.* v. *Netlist, Inc.*, No. C08 04144, Complaint for Declaratory Relief, (N.D. Ca Dated Aug. 29, 2008).
Intel® 6400/6402 Advanced Memory Buffer Datasheet, published Oct. 2006.
Letter from G. Hopkins Guy III, Orrick, Herrington & Sutcliffe LLP, to R. Scott Oliver, Morrison & Foerster, (Apr. 14, 2009).
Luthra et al. "Interface Synthesis Using Memory Mapping for an FPGA Platform," Proceedings of the 21st International Conference on Computer Design, 2003.
*MetaRAM, Inc.* v. *Netlist, Inc.* No. 3:09-cv-01309-VRW, MetaRam's Reply to Netlist's Counterclaims, (N.D. Ca. Filed Jun. 3, 2009).
*MetaRam, Inc.* v. *Netlist, Inc.*, No. 3:09-cv-01309-VRW, Netlist's Answer to Complaint and Counterclaims, (N.D. Ca, filed May 11, 2009).
*MetaRAM, Inc.* v. *Netlist, Inc.*, No. C09 01309, Complaint for Patent Infringement, (N.D. Ca. Filed Mar. 25, 2009).
Micron "DDR2 SDRAM Registered DIMM (RDIMM)," 2003 Micron Technology, Inc. 18 pages.
Micron "Synchronous DRAM Module MT18LSDT472," 1998, Micron Technology, Inc., 17 pages.
Micron Technical Note,"Decoupling Capacitor Calculations for a DDR Memory Channel," 2004, 3 pages.
Miles J. Murdocca et al., "Principles of Computer Architecture", Prentice Hall, Inc., Upper Saddle River, NJ, 2000, pp. 243-252.
Murdocca et al., "Principles of Computer Architecture," Prentice Hall, 2000, pp. 249-251.
*Netlist, Inc.* v. *MetaRam, Inc.*, No. 09-165-GMS, MetaRAM, Inc.'s Answer and Affirmative Defenses to Plaintiff's Complaint, dated Apr. 20, 2009.
*Netlist, Inc.* v. *MetaRAM, Inc.*, No. 1:09-ccv-00165-GMS, Complaint for Patent Infringement, (D. Del. Filed Mar. 12, 2009).
Non-Final Action Closing Prosecution mailed Sep. 1, 2010, for Control No. 95/001,339, filed Apr. 10, 2010, 17 pages.
Non-Final Action Closing Prosecution mailed Jun. 21, 2011, for Control No. 95/001,381, filed Jun. 9, 2010, 34 pages.
Non-Final Action Closing Prosecution mailed Mar. 12, 2012, for Control No. 95/001,337, filed Apr. 19, 2010, 33 pages.
Non-Final Action mailed Aug. 27, 2010, for Control No. 95/000,546, filed May 11, 2010, 16 pages.
Non-Final Action mailed Sep. 8, 2010, for Control No. 95/001,381, filed Jun. 9, 2010, 17 pages.
Non-Final Action mailed Apr. 4, 2011, for Control No. 95/001,339, filed Apr. 20, 2010, 61 pages. (merged with 95/000,578 and 95/000,579).
Non-Final Action mailed Jun. 15, 2011, for Control No. 95/001,381, filed Jun. 9, 2010, 33 pages.
Non-Final Action mailed Sep. 27, 2011, for Control No. 95/001,337, filed Apr. 19, 2010, 19 pages.
Non-Final Action mailed Oct. 4, 2011, for Control No. 95/001,339, filed Apr. 20, 2010, 77 pages. (merged with 95/000,578 and 95/000,579).
Non-Final Action mailed Oct. 14, 2011, for Control No. 95/001,339, filed Apr. 30, 2010, 99 pages. (merged with 95/000,578 and 95/000,579).
Non-Final Office Action mailed Nov. 16, 2011, for U.S. Appl. No. 95/001,758 filed Sep. 14, 2011, 25 pages.
Order Granting Request for Inter Partes Reexamination mailed Nov. 16, 2011, for U.S. Appl. No. 95/001,758, filed Sep. 14, 2011, 13 pages.
Order Granting Request for Inter Partes Reexamination mailed Aug. 9, 2010, for Control No. 95/000,546, filed May 11, 2010, 22 pages.
Order Granting Request for Inter Partes Reexamination mailed Aug. 27, 2010, for Control No. 95/001,337, filed Apr. 19, 2010, 21 pages.
Order Granting Request for Inter Partes Reexamination mailed Sep. 1, 2010, for Control No. 95/001,339, filed Apr. 20, 2010, 14 pages.
Order Granting Request for Inter Partes Reexamination mailed Sep. 8, 2010, for Control No. 95/000,381, filed Jun. 9, 2010, 21 pages.
Order Granting Request for Inter Partes Reexamination mailed Jan. 14, 2011, for Control No. 95/000,579, filed Oct. 21, 2010, 12 pages.
Order Granting Request for Inter Partes Reexamination mailed Jan. 18, 2011, for Control No. 95/000,577, filed Oct. 20, 2010, 17 pages.
Right of appeal Notice mailed Feb. 7, 2012, for Control No. 95/001,381, 33 pages.
Right of Appeal Notice mailed Jun. 22, 2012, for Control No. 95/001,337, filed Jun. 4, 2010, 34 pages.
PC133 SDRAM Registered DIMM Design Specification, Revision 1.1, Aug. 1999, 62 pages.
Texas Instruments, "TM2SR72EPN 2097152 by 72-Bit, TM4SRT2EPN 4194304 by 72-Bit, Synchronous Dynamic RAM Modules," 1997, 15 pages.
U.S. District Court Central District of California, Case No. CV09 06900, *Netlist, Inc.* vs. *Inphi Corporation*, Complaint for Patent Infringement, filed Sep. 22, 2009 in 10 pages.
U.S. District Court Central District of California, Case No. CV09 06900, *Netlist, Inc.* vs. *Inphi Corporation*, Defendant Inphi Corporation's Answer to Plaintiff's Complaint for Patent Infringement, filed Nov. 12, 2009 in 6 pages.
U.S. District Court Central District of California, Case No. CV09 06900, *Netlist, Inc.* vs. *Inphi Corporation*, Defendant Inphi Corporation's Answer to Plaintiff's First Amended Complaint for Patent Infringement, filed Feb. 11, 2010 in 9 pages.
U.S. District Court Central District of California, Case No. CV09 06900, *Netlist, Inc.* vs. *Inphi Corporation*, Defendant Inphi Corporation's Notice of Motion and Motion for Stay Pending Reexaminations and Interference Proceeding Regarding the Patents-In-Suit; Memorandum of Points and Authorities in Support Thereof, filed Apr. 21, 2010 in 28 pages.
U.S. District Court Central District of California, Case No. CV09 06900, *Netlist, Inc.* vs. *Inphi Corporation*, Plaintiff Netlist Inc's Opposition to Defendant Inphi Corporation's Motion for Stay Pending Reexaminations and Interference Proceedings Regarding the Patents-In-Suit, filed May 3, 2010 in 23 pages.
U.S. District Court Central District of California, Case No. CV09 06900, *Netlist, Inc.* vs. *Inphi Corporation*, Plaintiff Netlist, Inc's First Amended Complaint for Patent Infringement, filed Dec. 23, 2009 in 8 pages.
U.S. District Court Northern District of California, Case No. CV08 04144, *Google Inc.* v. *Netlist, Inc.*, Defendant Netlist, Inc.'s Claim Construction Reply Brief, filed Sep. 22, 2009 in 19 pages.
U.S. District Court Northern District of California, Case No. CV08 04144, *Google Inc.* v. *Netlist, Inc.*, Defendant Netlist, Inc.'s Opening Claim Construction Brief, filed Jul. 28, 2009 in 21 pages.
U.S. District Court Northern District of California, Case No. CV08 04144, *Google Inc.* v. *Netlist, Inc.*, Defendant Netlist, Inc.'s Opposition to Google Inc's Motion for Summary Judgment of Invalidity, filed Jul. 6, 2010 in 13 pages.
U.S. District Court Northern District of California, Case No. CV08 04144, *Google Inc.* v. *Netlist, Inc.*, Exhibit A to Joint Claim Construction and Prehearing Statement, filed Jun. 12, 2009 in 2 pages.
U.S. District Court Northern District of California, Case No. CV08 04144, *Google Inc.* v. *Netlist, Inc.*, Exhibit B to Joint Claim Construction and Prehearing Statement, filed Jun. 12, 2009 in 36 pages.
U.S. District Court Northern District of California, Case No. CV08 04144, *Google Inc.* v. *Netlist, Inc.*, Joint Claim Construction and Prehearing Statement, filed Jun. 12, 2009 in 5 pages.
U.S. District Court Northern District of California, Case No. CV08 04144, *Google Inc.* v. *Netlist, Inc.*, Netlist, Inc.'s Answer to Complaint and Counterclaims, filed Nov. 18, 2008 in 9 pages.
U.S. District Court Northern District of California, Case No. CV08 04144, *Google Inc.* v. *Netlist, Inc.*, Order Re Claim Construction, filed Nov. 16, 2009 in 1 page.
U.S. District Court Northern District of California, Case No. CV08 04144, *Google Inc.* v. *Netlist, Inc.*, Plaintiff Google's Reply to Counterclaims, filed Dec. 8, 2008 in 4 pages.
U.S. District Court Northern District of California, Case No. CV08 04144, *Google Inc.* v. *Netlist, Inc.*, Stipulation Re: Additional Agreed-Upon Claim Constructions,filed Oct. 28, 2009 in 3 pages.

(56) References Cited

OTHER PUBLICATIONS

U.S. District Court Northern District of California, Case No. CV08 04144, *Google Inc.* vs. *Netlist, Inc.*, [Redacted] Google Inc.'s Responsive Claim Construction Brief, filed Aug. 25, 2009 in 30 pages.
U.S. District Court Northern District of California, Case No. CV08 04144, *Google Inc.* vs. *Netlist, Inc.*, Amended Exhibit A to Joint Claim Construction and Prehearing Statement, filed Oct. 28, 2009 in 1 page.
U.S. District Court Northern District of California, Case No. CV08 04144, *Google Inc.* vs. *Netlist, Inc.*, Appendix 1 to Google's Responsive Claim Construction Brief, filed Nov. 12, 2009 in 4 pages.
U.S. District Court Northern District of California, Case No. CV08 04144, *Google Inc.* vs. *Netlist, Inc.*, Attachment 1 to Exhibit B to Joint Claim Construction and Prehearing Statement, filed Jun. 12, 2009 in 7 pages.
U.S. District Court Northern District of California, Case No. CV08 04144, *Google Inc.* vs. *Netlist, Inc.*, Attachment 2 to Exhibit B to Joint Claim Construction and Prehearing Statement, filed Jun. 12, 2009 in 12 pages.
U.S. District Court Northern District of California, Case No. CV08 04144, *Google Inc.* vs. *Netlist, Inc.*, Complaint for Declaratory Relief, filed Aug. 29, 2008 in 49 pages.
U.S. District Court Northern District of California, Case No. CV09 05718, *Netlist, Inc.* vs. *Google, Inc.*, Complaint for Patent Infringement, filed Dec. 4, 2009 in 47 pages.
U.S. District Court Northern District of California, Case No. CV09 05718, *Netlist, Inc.* vs. *Google, Inc.*, Defendant Google Inc's Responsive Claim Construction Brief, filed Aug. 4, 2010 in 27 pages.
U.S. District Court Northern District of California, Case No. CV09 05718, *Netlist, Inc.* vs. *Google, Inc.*, Exhibit A to Joint Claim Construction and Prehearing Statement under Patent L.R. 4-3, filed Jun. 25, 2010 in 2 pages.
U.S. District Court Northern District of California, Case No. CV09 05718, *Netlist, Inc.* vs. *Google, Inc.*, Exhibit B to Joint Claim Construction and Prehearing Statement under Patent L.R. 4-3, filed Jun. 25, 2010 in 23 pages.
U.S. District Court Northern District of California, Case No. CV09 05718, *Netlist, Inc.* vs. *Google, Inc.*, Google's Answer to Plaintiff's Complaint for Patent Infringement; and Assertion of Counterclaims, filed Feb. 12, 2010 in 13 pages.
U.S. District Court Northern District of California, Case No. CV09 05718, *Netlist, Inc.* vs. *Google, Inc.*, Joint Claim Construction and Prehearing Statement Under Patent Local Rule 4-3, filed Jun. 25, 2010 in 5 pages.
U.S. District Court Northern District of California, Case No. CV09 05718, *Netlist, Inc.* vs. *Google, Inc.*, Plaintiff Netlist, Inc.'s Reply Claim Construction Brief, filed Aug. 16, 2010 in 17 pages.
U.S. District Court Northern District of California, Case No. CV09 05718, *Netlist, Inc.* vs. *Google, Inc.*, Plaintiff Netlist, Inc.'s Reply to Defendant Google Inc.'s Counterclaim, filed Mar. 8, 2010 in 11 pages.
U.S. District Court Northern District of California, Case No. CV09 05718, *Netlist, Inc.* vs. *Google, Inc.*, Plaintiff Netlist, Inc's Opening Claim Construction Brief, filed Jul. 16, 2010 in 29 pages.
US District Court Civil Docket; *Google Inc.* v. *Netlist Inc.*; 4:08cv04144; filed Aug. 29, 2008.
US District Court Civil Docket; *Netlist Inc.* v. *Google Inc.*; 4:09cv5718, filed Dec. 4, 2009 in 10 pages.
US District Court Civil Docket; *Netlist Inc.* v. *Inphi Corporation*; 2:09cv6900; Date filed Sep. 22, 2009.
Vogt, Pete, "Fully Buffered DIMM (FB-DIMM) Server Memory Architecture: Capacity, Performance, Reliability, and Longevity," Intel, Feb. 18, 2004, 33 pages.

* cited by examiner

CIRCUIT PROVIDING LOAD ISOLATION AND NOISE REDUCTION

CROSS-REFERENCE TO RELATED APPLICATIONS

The present application is a continuation of U.S. patent application Ser. No. 12/422,853, filed Apr. 13, 2009, and incorporated in its entirety by reference herein, which claims the benefit of priority from U.S. Provisional Appl. No. 61/044,839, filed Apr. 14, 2008, from U.S. Provisional Appl. No. 61/044,825, filed Apr. 14, 2008, and from U.S. Provisional Appl. No. 61/044,801, filed Apr. 14, 2008, each of which are incorporated in their entirety by reference herein. This application is also related to U.S. patent application Ser. No. 12/422,912, filed on Apr. 13, 2009, and U.S. patent application Ser. No. 12/422,925, filed on Apr. 13, 2009, now U.S. Pat. No. 8,001,434, both of which are incorporated in their entirety by reference herein, and U.S. patent application Ser. No. 13/183,253, filed Jul. 14, 2011.

BACKGROUND

1. Field

The present application relates generally to the field of electrical signal integrity and more specifically to circuits for improving electrical signal integrity.

2. Description of the Related Art

As the demand on the performance of electronic systems increase, the systems include higher speed processors and higher memory densities with relatively heavy fan-outs. However, higher speed processors and higher memory densities translate to higher power dissipation and increased memory access time, impairing the performance of the system.

Traditional systems sometimes incorporate multiplexers and/or demultiplexers to help quiet inactive signal paths, minimizing the overall dynamic power dissipation, and isolating unused subsystems. FIG. 1 schematically illustrates an example of such a system 10 which incorporates a multiplexer-demultiplexer 12 to isolate unused subsystems of a plurality of subsystems 16, 18. This arrangement can reduce the load on each driver 14 when the original signal path includes multiple destinations by inserting a multiplexer on each signal path between the driver 14, the receiver 20 and the multiple destinations. However, the multiplexer and/or demultiplexer 12 can present transmission line discontinuity regions in electronic systems (e.g., in electronic systems with signal paths with electrical lengths longer than ¼ of the wavelength of the operational frequency or the signal transition rate). In such systems, signal reflections may occur, changing wave characteristics and degrading system performance. These signal reflections may cause signal distortions and signal integrity issues which can contribute to reduced system performance and eventual failure of the system, thereby limiting the effectiveness of the multiplexer and/or demultiplexer in addressing the signal integrity and power dissipation issues.

In memory applications, some systems control "chip select" or device select signals, along with the memory address and control signals, based on the device select signals, in order to disable memory devices when they are not being accessed. FIG. 2 schematically illustrates an example of such a system 20 which isolates unused subsystems of a plurality of subsystems 16, 18 using device select signals 22, 24 (e.g., chip select signals). The devices are disabled by not activating (asserting) the address, control, and/or device select signals, thus logically isolating the memory devices which are not accessed. This arrangement generally requires a device select signal for each physical memory rank and the address and device select signals are generally controllable based on whether the corresponding memory device or group of memory devices is being accessed. Generating controllable address and device select signals can introduce timing delays on the device select, address, and control paths. In addition, this arrangement does not address the power dissipation and may degrade performance degradation by, for example, requiring that secondary control signals be generated for the memory devices.

SUMMARY

Certain embodiments described herein include a memory module comprising a printed circuit board comprising at least one connector configured to be operatively coupled to a memory controller of a computer system. The memory module comprises a plurality of memory devices on the printed circuit board and a circuit. The circuit comprises a first set of ports comprising a plurality of bi-directional ports, each port of the first set of ports operatively coupled to at least one memory device of the plurality of memory devices. The memory module further comprises a second set of ports comprising one or more bi-directional ports, each port of the second set of ports operatively coupled to the at least one connector. The memory module of certain embodiments comprises a switching circuit configured to selectively operatively couple one or more ports of the second set of ports to one or more ports of the first set of ports. The one or more ports of the first set of ports and the one or more ports of the second set of ports each comprise a correction circuit in certain embodiments. The correction circuit reduces noise in one or more signals transmitted between the one or more ports of the first set of ports and the one or more ports of the second set of ports.

A method of using a memory module with a computer system is described in certain embodiments. The method includes providing a memory module comprising a printed circuit board having at least one connector configured to be operatively coupled to a memory controller of a computer system and to a plurality of memory devices. The memory module further including a circuit which comprises a first set of ports comprising a plurality of bi-directional ports, each port of the first set of ports operatively coupled to at least one memory device of the plurality of memory devices. The circuit further comprises a second set of ports comprising one or more bi-directional ports. Each port of the second set of ports is operatively coupled to the at least one connector. The circuit is configured to selectively operatively couple one or more ports of the second set of ports to one or more ports of the first set of ports in some embodiments. The one or more ports of the first set of ports and the one or more ports of the second set of ports each comprise a correction circuit. The correction circuit reduces noise in one or more signals transmitted between the one or more ports of the first set of ports and the one or more ports of the second set of ports. The method includes activating the circuit to selectively operatively couple at least one of the one or more ports of the second set of ports to at least one of the one or more ports of the first set of ports. The method also includes activating the circuit to reduce noise in the one or more signals.

Certain embodiments are described herein provide a circuit comprising a first set of ports comprising a plurality of bi-directional ports. Each port of the first set of ports may be configured to be operatively coupled to at least one memory device of a plurality of memory devices on a printed circuit board. The circuit further comprises a second set of ports comprising one or more bi-directional ports, each port of the second set of ports configured to be operatively coupled to at least one connector on the printed circuit board. The at least one connector is configured to be operatively coupled to a memory controller of a computer system. The circuit further comprises a switching sub-circuit configured to selectively operatively couple one or more ports of the second set of ports to one or more ports of the first set of ports. The one or more ports of the first set of ports and the one or more ports of the second set of ports each comprise a correction circuit in certain embodiments. The correction circuit can reduce noise in one or more signals transmitted between the one or more ports of the first set of ports and the one or more ports of the second set of ports.

In certain embodiments, a circuit comprises a first set of ports comprising a plurality of bi-directional ports. Each port of the first set of ports can be configured to be operatively coupled to at least one subsystem of a plurality of subsystems. The circuit may comprise a second set of ports comprising one or more bi-directional ports, each port of the second set of ports configured to be operatively coupled to at least one subsystem of one or more subsystems. In certain embodiments, the circuit comprises a switching sub-circuit configured to selectively operatively couple one or more ports of the second set of ports to one or more ports of the first set of ports. The one or more ports of the first set of ports and the one or more ports of the second set of ports each comprise a correction circuit in certain embodiments. The correction circuit can reduces noise in one or more signals transmitted between the one or more ports of the first set of ports and the one or more ports of the second set of ports.

DETAILED DESCRIPTION

Electronic systems incorporating devices and methods in accordance with embodiments described herein may include memory subsystems that contain multiple memory boards or modules that are driven by a single memory controller which synchronizes memory access and manages memory coherency. However, having a single memory controller may gradually degrade system performance and increase power consumption as the physical and the logical size of the memory subsystem increases. Increases in memory speed may further increase the power consumption. Additionally, impedance mismatches between the system board, the memory boards, and the memory devices may also substantially degrade the performance and power efficiency of traditional memory systems. Such memory systems may be used with a power supply which helps to stabilize the voltage level, and/or a thermo-mechanical component to moderate memory subsystem temperature, and/or software for throttling the processor to lower the memory access rate.

Embodiments described herein address these speed and power issues in memory systems. For example, a circuit of certain embodiments can comprise an isolation switch and can logically isolate inactive subsystems and reduce signal reflection and/or other noise at, for example, the interface between the system board and the memory board and at the interface between the memory board and the memory devices.

Certain embodiments described herein present a circuit for isolating inactive sub-systems and maintaining and improving signal integrity in a variety of systems. Certain embodiments described herein are used to increase the performance of electronic systems without increasing the power dissipation or the memory access time. In certain embodiments, a plurality of circuits are configured so as to improve the interconnection (e.g., timing, power consumption, and/or signal integrity) between each of the plurality of circuits and a plurality of corresponding devices (e.g., memory devices) of a system or subsystem (e.g., a memory module of a computer system). For example, the data width of each of the plurality of circuits may be selected to optimize the interconnection (e.g., timing, power consumption, and/or signal integrity). In various embodiments, the data width of each of the plurality of devices may be 4, 8, or 16 bits, for example.

Certain embodiments described herein describe a circuit for use in high performance electronic systems which may contain transmission lines and relatively heavy fan-outs. A circuit is described herein which, in certain embodiments, includes at least some of the following components: a signal router, a programmable coarse impedance matching circuit, a self-adjusting damper circuit, a filter and/or a repeater/amplifier.

Figure 1:
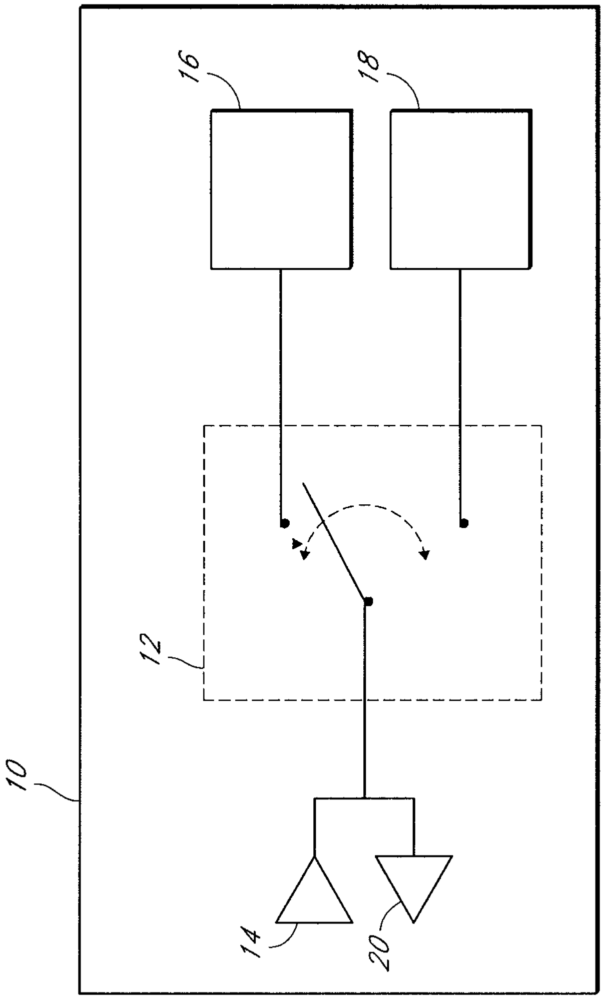
FIG. 1 schematically illustrates an example system which isolates unused subsystems and incorporates a multiplexer-demultiplexer.
Figure 2:
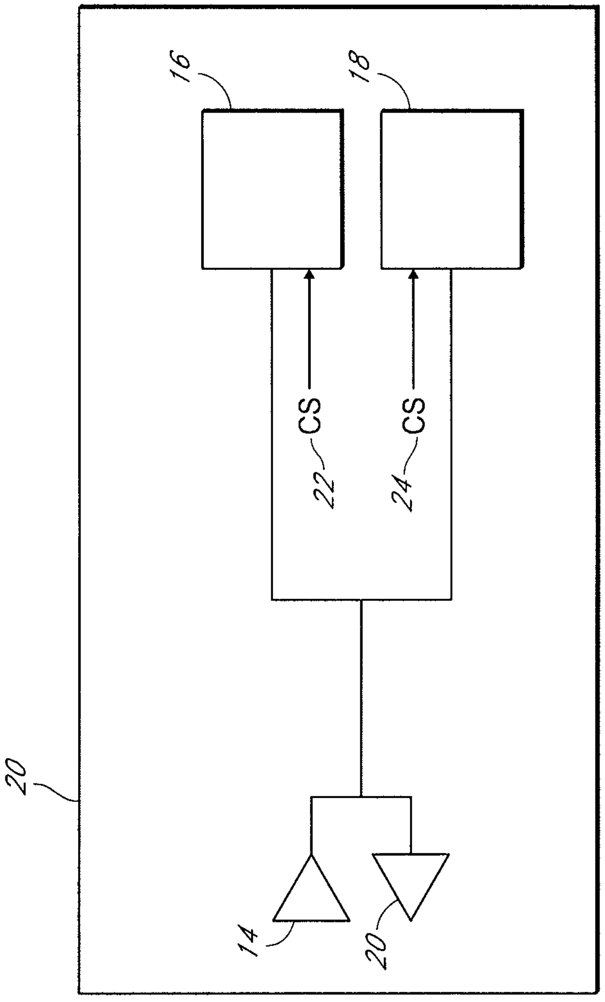
FIG. 2 schematically illustrates an example system which isolates unused subsystems using device select signals.
Figure 3:
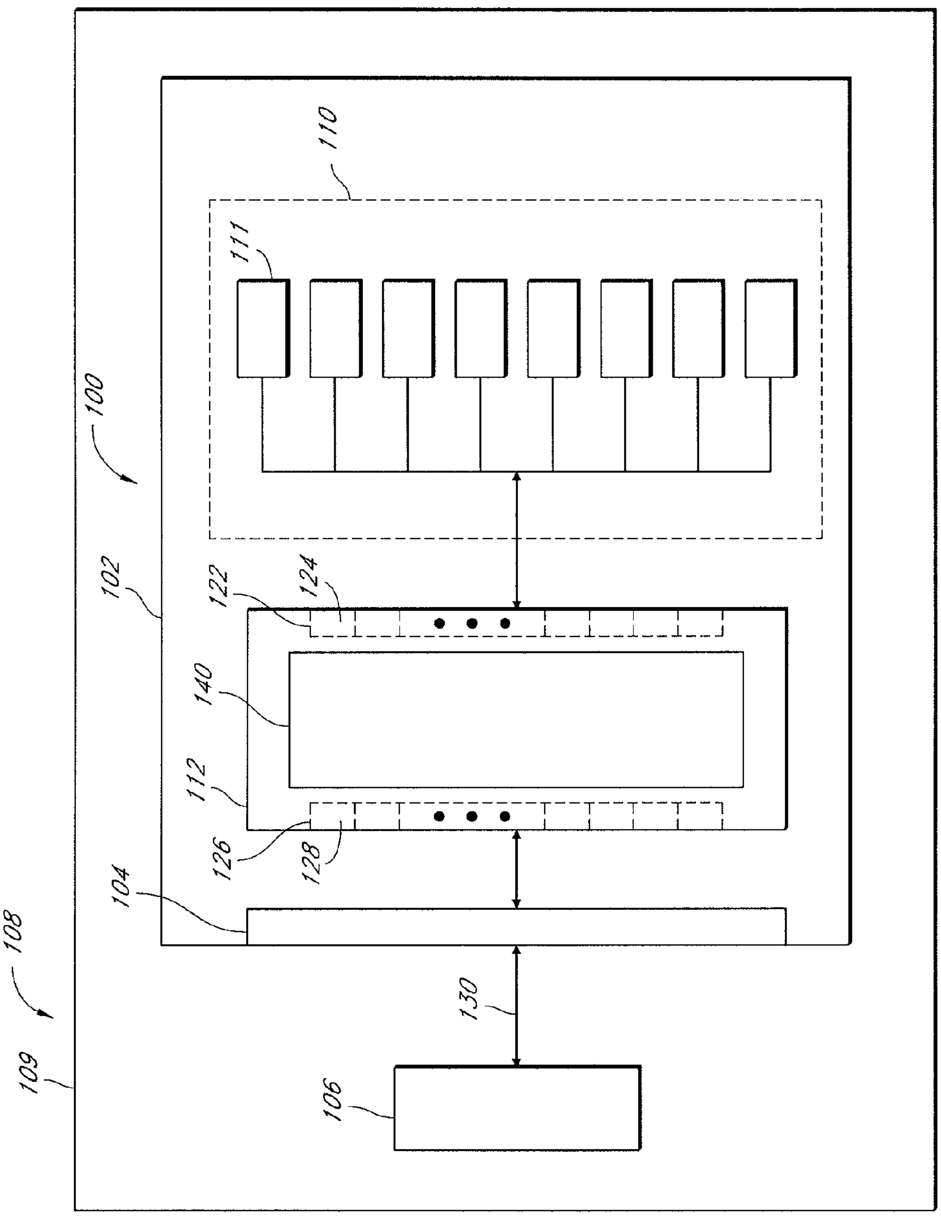
FIG. 3 schematically illustrates an example memory system incorporating a memory module in accordance with certain embodiments described herein.

FIG. 3 schematically illustrates an example system incorporating a memory module 100 in accordance with certain embodiments described herein. The memory module 100 comprises a printed circuit board (PCB) 102. The PCB 102 includes at least one connector 104 configured to be operatively coupled to a memory controller 106 of a computer system 108. The memory module 100 includes a plurality of memory devices 110 on the PCB 102.

The memory module 100 of certain embodiments further includes a circuit 112 comprising a first set of ports 122 comprising a plurality of bi-directional ports 124, each port

124 of the first set of ports 122 operatively coupled to at least one memory device 110 of the plurality of memory devices 110. The circuit 112 further comprises a second set of ports 126 comprising one or more bi-directional ports 128, each port 128 of the second set of ports 126 operatively coupled to the at least one connector 104. The circuit 112 further comprises a switching sub-circuit 140 configured to selectively operatively couple one or more ports 128 of the second set of ports 126 to one or more ports 124 of the first set of ports 122. The one or more ports 124 of the first set of ports 122 and the one or more ports 128 of the second set of ports 126 each comprises a correction circuit 150 (see, e.g., FIG. 4) which reduces noise in one or more signals transmitted between the one or more ports 124 of the first set of ports 122 and the one or more ports 128 of the second set of ports 126.

In certain embodiments, the memory module 100 has a memory capacity of 512-MB, 1-GB, 2-GB, 4-GB, 8-GB, or higher or lower. Other memory capacities are also compatible with certain embodiments described herein. In addition, memory modules 100 having widths of 4 bits, 8 bits, 16 bits, 32 bits, as well as other widths (in bytes or in bits), are compatible with embodiments described herein. In certain embodiments, the PCB 102 has an industry-standard form factor. For example, the PCB 102 can have a low profile (LP) form factor with a height of 30 millimeters and a width of 133.35 millimeters. In certain other embodiments, the PCB 102 has a very high profile (VHP) form factor with a height of 50 millimeters or more. In certain other embodiments, the PCB 102 has a very low profile (VLP) form factor with a height of 18.3 millimeters. Other form factors including, but not limited to, small-outline (SO-DIMM), unbuffered (UDIMM), registered (RDIMM), fully-buffered (FBDIMM), mini-DIMM, mini-RDIMM, VLP mini-DIMM, micro-DIMM, and SRAM DIMM are also compatible with certain embodiments described herein. For example, in other embodiments, certain non-DIMM form factors are possible such as, for example, single in-line memory module (SIMM), multi-media card (MMC), and small computer system interface (SCSI).

In certain embodiments, the plurality of memory devices 110 of the memory module 100 may be arranged as one or more ranks, each rank of memory generally having a bit width. In certain embodiments, each rank may comprise an independent set of memory devices 111 of the plurality of memory devices 110 that can be accessed by the memory controller 106 to access the full bit-width of the memory bus of the memory module 100. For example, a memory module 100 in which each rank of the memory module is 64 bits wide is described as having an "x 64" organization. Similarly, a memory module 100 having 72-bit-wide ranks is described as having an "x 72" organization. The number of memory devices 111 of a memory module 100 can be increased by increasing the number of memory devices 111 per rank or by increasing the number of ranks of the memory module 100. For example, a memory module with four ranks with each rank having N 512-MB memory devices 111 has double the memory capacity of a memory module with two ranks with each rank having N 512-MB memory devices 111 and four times the memory capacity of a memory module with one rank with each rank having N 512-MB memory devices.

During operation, one or more ranks of a memory module 100 may be selected or activated from the plurality of ranks by control signals that are received from a component of the system (e.g., a system memory controller 106 or a local memory controller of the memory module 100). Examples of such control signals include, but are not limited to, rank-select signals, also called chip-select signals. In certain other embodiments, the memory module 100 comprises only one rank of memory devices 111.

As discussed, the PCB 102 includes at least one connector 104 configured to be operatively coupled to a memory controller 106 of a computer system 108, such as a host computer system 108. For example, the connector 104 is electrically coupled, logically coupled, or both, with the memory controller 106 in some other manner. In certain embodiments, the connector 104 comprises a wireless radio frequency (RF) interface or a portion thereof and is wirelessly connected (e.g., via one or more RF antennas) to the memory controller 106. In some embodiments, some other connection mechanism is used besides the connector 104. Examples of host computer systems 108 include, but are not limited to, blade servers, 1U servers, personal computers (PCs), data storage systems and other applications in which space is constrained or limited. The memory controller 106 may comprise a disk controller of the computer system 108, for example. The memory controller 106 of certain embodiments may be mounted on a system board 109 of the host computer 108. The connector 104 can comprise a plurality of edge connections distributed along one or more edges of the PCB 102 which fit into a corresponding slot connector of the host system. The connector 104 of certain embodiments provides a conduit for power voltage as well as data, address, and control signals between the memory module 100 and the host system 108. For example, the connector 104 can comprise a standard 240-pin DDR2 edge connector. Additionally, in certain embodiments, more than one memory module 100 is coupled to the host system 108.

The plurality of memory devices 110 on the PCB 102 may include one or more volatile memory components. For example, the plurality of memory devices 110 of certain embodiments comprises two or more dynamic random-access memory (DRAM) elements 111. For example, in the block diagram of FIG. 3, the plurality of memory devices 110 comprises eight DRAM devices 111. Types of DRAM devices 111 compatible with certain embodiments described herein include, but are not limited to, DDR, DDR2, DDR3, and synchronous DRAM (SDRAM). The memory devices 111 may comprise other types of memory elements such as static random-access memory (SRAM). In addition, volatile memory devices 111 having bit widths of 4, 8, 16, 32, as well as other bit widths, are compatible with certain embodiments described herein. Memory devices 111 compatible with certain embodiments described herein have packaging which include, but are not limited to, thin small-outline package (TSOP), ball-grid-array (BGA), fine-pitch BGA (FBGA), micro-BGA (μBGA), mini-BGA (mBGA), and chip-scale packaging (CSP).

The first set of ports 122 of the circuit 112 comprises a plurality of bi-directional ports 124 where each port of the first set of ports 122 is operatively coupled to at least one memory device 111 of the plurality of memory devices 110. In addition, the second set of ports 126 of the connector 104 comprises one or more bi-directional ports 128 where each port of the second set of ports 126 is operatively coupled to the at least one connector 104. The switching sub-circuit 140 is configured to selectively operatively couple one or more ports 128 of the second set of ports 126 to one or more ports 124 of the first set of ports 122. The operative coupling of the first set of ports 122 to the memory devices 110, the second set of ports 126 to the connector 104, and the selective operative coupling between the first and second set of ports 122, 126 may comprise electrical coupling, logical coupling, or both.

In other embodiments, optical coupling or some other manner of coupling may be employed.

In certain embodiments, each bi-directional port 128 of the second set of ports 126 may correspond to a signal of a memory bus 130 which operatively couples the memory controller 106 and the memory module 100 via the connector 104. For example, the memory controller 106 may generally read data from and/or write data to the plurality of memory devices 110 on the memory module 100 through the memory bus 130 and through the bi-directional ports 124, 128. In certain embodiments, the number of bi-directional ports 128 of the second set of ports 126 may correspond to the number of data bits in the memory bus 130 (i.e., the bit-width of the memory bus 130).

In certain embodiments, each of the bi-directional ports 124 in the first set of ports 122 may correspond to and be operatively coupled to a signal port of one of the memory devices 111 of the plurality of memory devices 110. The bi-directional ports 124 correspond to the data signal ports, for example, of the plurality of memory devices 110. Because each memory device 111 includes associated data signal ports, the number of bi-directional ports 124 in the first set of ports of certain embodiments may be larger than the number of bi-directional ports 128 in the second set of ports 122 (e.g., the number of bits in the memory bus 130). In general, the overall number of ports of the plurality of memory devices 110 and corresponding bi-directional ports 124 in the first set of ports 126 may depend on the organization of the memory module. For example, the number of ports may depend on the number of memory devices and/or the number of ranks in the memory module. In certain embodiments, the memory module 100 includes a plurality of circuits 112. The circuits 112 may be configured so as to improve the interconnection (e.g., timing, power consumption, and/or signal integrity) between each of the plurality of circuits 112 and a plurality of corresponding memory devices 111 of memory module 100. For example, the data width of each of the plurality of circuits 112 may be selected to optimize the interconnection (e.g., timing, power consumption, and/or signal integrity). In various embodiments, the data width of each of the plurality of devices may be 4, 8, or 16 bits, for example. Other data widths are possible in other embodiments. In some embodiments, the data width of each circuit 112 corresponds to the data width of each of the memory devices 111 such that each circuit 112 is operatively coupled to one of the plurality of memory devices 110. In other embodiments, the data width of each circuit 112 corresponds to a multiple of the data width of each memory device 111 such that each circuit 112 may be operatively coupled to the data bits of more than one memory device 111. In various embodiments, the data width of each circuit 112 corresponds to a segment of the data width of each memory device 111 or to segments of multiple memory devices 111. As such, in some embodiments, each circuit 112 may be operatively coupled to a segment of the data bits of one memory device 111 or to segments of more than one memory device 111. Other configurations are possible which optimize the interconnection (e.g., timing, power consumption, and/or signal integrity). In addition, in certain embodiments, the location of each of the plurality of circuits 112 on the PCB 102 is selected to optimize the interconnection, timing, power consumption, and signal integrity.

In other embodiments, the bi-directional ports 124 correspond to one or more other bits of the memory bus 130 instead of, or in addition to, the data bits. For example, one or more of the ports 124 may correspond to address, chip select, control (e.g., read/write) signals. Moreover, in some embodiments, one or more ports of the first set of ports 122 is not bi-directional. For example, in one embodiment, signals corresponding to address, chip select and/or control signals from the first set of ports 122 to the plurality of memory devices 110 and not vice versa. For example, one or more of the address, chip select, and control signals may be used to control the routing of the bi-directional ports 124 which correspond to data bits.

As discussed, the switching sub-circuit 140 is configured to selectively operatively couple one or more ports of the second set of ports 126 to one or more ports of the first set of ports 122. In certain embodiments, the switching sub-circuit 112 may be capable of interconnecting any number of the second set of ports 126 to any number of the first set of ports 122 simultaneously. In certain embodiments, the switching sub-circuit 140 can pass signals (e.g., information such as the data signals described above) from one port 128 of the second set of ports 126 to an operatively coupled port 124 of the first set of ports 122 and vice versa. Additionally, the switching sub-circuit 140 of some embodiments can pass signals from one port 128 of the second set of ports 126 to multiple operatively coupled ports 124 of the first set of ports 122 and vice versa. In certain embodiments, the switching sub-circuit 140 isolates and provides a known static value to all un-driven ports, thereby reducing any dynamic power consumption associated with floating or toggling electrical nodes.

The switching sub-circuit 140 of certain embodiments can function as an isolation switch which isolates and/or inactivates individual subsystems not actively transferring information. For example, in an example embodiment, the plurality of memory devices 110 comprises multiple independently accessible ranks. When the memory controller accesses one of the ranks of the memory module 100, the switching sub-circuit 140 isolates and/or inactivates at least the one or more other, un-accessed ranks. For example, the switching sub-circuit 140 does not operatively couple ports from the second of set of ports 126 to the first set of ports 122 which are coupled to the memory devices 111 of the un-accessed one or more ranks of memory devices 110. In certain embodiments, the switching sub-circuit 140 may function as or be characterized as a scalable isolation switch router which routes the information from one subsystem to another (e.g., host computer 108 to the memory module 100 via the memory controller 106), establishing a one-to-one connection for transferring data from point-to-point, and/or establishing a one-to-many connection for broadcasting data. The switching sub-circuit 140 comprises or is characterized as a bi-directional multiplexer-demultiplexer in certain embodiments. In other embodiments, the switching sub-circuit 140 comprises or is characterized as a router.

In certain embodiments, the memory module 100 further includes circuitry (not shown) for controlling the operation of the circuit 112 and the components therein (e.g., the switching sub-circuit 140 and the correction circuit 150, as described more fully below). For example, in one embodiment, the memory module 100 comprises a local memory controller which is operatively coupled to one or more control inputs (not shown) of the circuit 112 to control the selective coupling of the second set of ports 126 to the first set of ports 122. In certain other embodiments, some other component of the memory module 100 controls the operation of the circuit 112 or the circuit 112 comprises internal control circuitry. In various embodiments, the circuitry for controlling the circuit 112 includes discrete logic, one or more microprocessors, a field-programmable gate array (FPGA), or a computer-programmable logic device (CPLD). In yet other configurations, an external component controls the operation of the circuit 112.

The circuit 112 of certain embodiments comprises one physically integral component (e.g., one integrated circuit package mounted on the memory module 100). Various alternative configurations for the physical organization of the circuit 112 are possible, however. In certain other embodiments, the circuit 112 comprises multiple, physically separate components. For example, in one embodiment, the circuit 112 comprises one physically separate component per memory device 111 (e.g., integrate circuit packages mounted on the memory module 100). In another embodiment, the circuit 112 comprises one physically separate component per memory rank. In some embodiments, the circuit 112 comprises one physically separate component corresponding to multiple memory devices 111.

Figure 4:
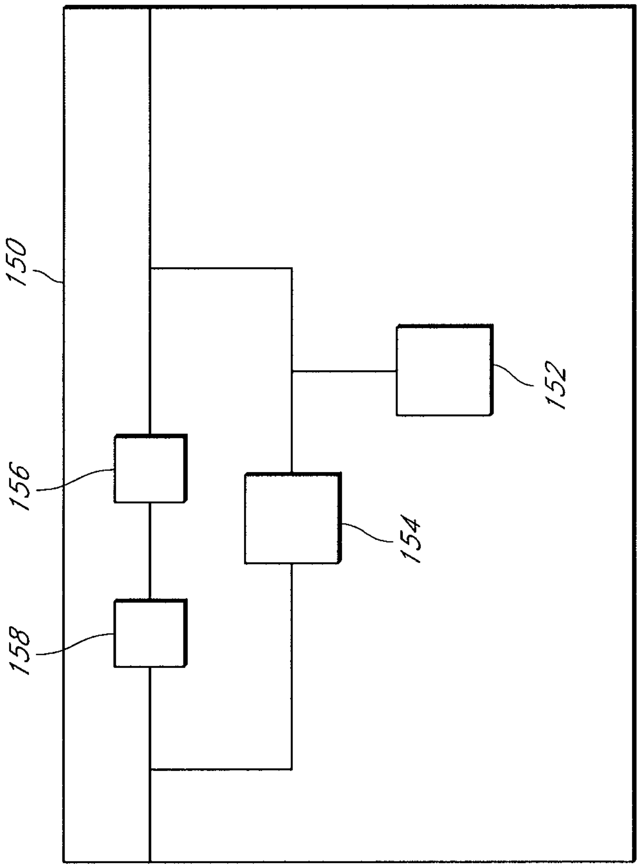
FIG. 4 schematically illustrates an example correction circuit in accordance with certain embodiments described herein.

FIG. 4 schematically illustrates an example correction circuit 150 in accordance with certain embodiments described herein. As shown, in certain embodiments, the correction circuit 150 comprises one or more correction elements (e.g., at least one coarse correction element 152 to provide coarse correction of the noise and at least one fine correction fine correction element 154 to provide fine correction of the noise). The correction circuit 150 of certain embodiments further comprises at least one filter element 156. In certain embodiments, the correction circuit 150 further comprises at least one repeater/amplifier element 158 which improves the signal quality of the one or more signals.

Referring to FIGS. 3 and 4, the correction circuit 150 reduces noise in one or more signals transmitted between the one or more ports of the first set of ports 122 and the one or more ports of the second set of ports 126. For example, the correction circuit 150 may reduce noise due to impedance mismatches (e.g., due to discontinuity regions) at nodes between the memory controller 106 and the plurality of memory devices 110. In certain embodiments, the noise may comprise signal reflections. For example, in certain embodiments, the signal paths between the host computer 108 and the plurality of memory devices 110 or portions thereof may be characterized as transmission lines if they are greater than or about equal to a particular fraction of the wavelength of the signal, such as, for example, greater than or equal to about ¼ of the wavelength of the signal. In other configurations, the signal paths may be characterized as transmission lines when the signal path is greater than or equal to some other fraction of the wavelength of the signal such as, for example, ½, ⅛, or 1/10 of the wavelength. In certain embodiments, the system (e.g., memory module 100) incorporating the circuit 112 has signal delays which are related to signal characteristics such as the signal transition rate and/or the rise/fall time of the signals. For example, the system incorporating the circuit 112 may include signal delays which are more than some fraction (e.g., ½) of the signal transition rate and/or the rise/fall time of the signals. In other embodiments, the signal delays are related in some other way to the signal transition rate and/or the rise/fall time of the signals (e.g., are more than ¼, ⅛ of those values) or are related to some other signal property.

The reflections may be caused by one or more discontinuity regions along the signal paths. For example, discontinuity regions comprise points or regions at which the characteristic impedance of the corresponding signal path changes. For example, the interface between the system board 109 of the host computer 108 and the memory module 100 (e.g., the connector 104) may comprise a discontinuity region along each of the signal paths. The interfaces between the connector 104 of the memory module 100 and each of the memory devices 111 mounted on the PCB 102 may comprise one or more discontinuity regions along each of the signal paths.

The noise may comprise cross-coupling between the signal paths in certain embodiments. For example, a cross-coupling impedance may be present between one or more of the signal paths or portions thereof. In certain embodiments, the cross-coupling impedance may include cross-coupling due to cross-coupling capacitance, inductance (e.g., mutual inductance), transconductance, or a combination thereof. Additionally, a variety of other noise are possible such as, for example, electromagnetic interference or other types of noise.

Figure 5:
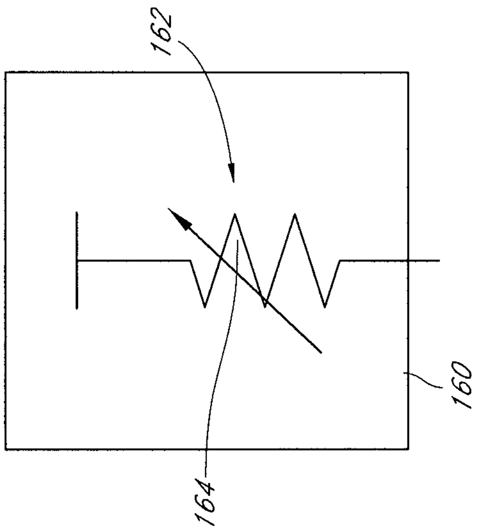
FIG. 5 schematically illustrates an example programmable impedance matching circuit in accordance with certain embodiments described herein.

Referring to FIG. 4, in certain embodiments, the correction circuit 150 includes one or more elements to provide for coarse correction of signal noise due to impedance mismatches (e.g., discontinuity regions) in the system. The at least one coarse correction element 152 comprises at least one programmable impedance matching circuit in certain embodiments. FIG. 5 schematically illustrates an example programmable impedance matching circuit 160 in accordance with certain embodiments described herein. For example, the programmable impedance matching circuit 160 may comprises at least one programmable resistor 162. The resistance of the programmable resistor 162 may be controllable by a control signal 164. In certain embodiments, the coarse correction element 152 may be integrated with the switching sub-circuit 140, the fine correction element 154, the filter element 156, and/or the repeater/amplifier element 158. Alternatively, in other embodiments, the coarse correction element 152 may be implemented with discrete components.

In other embodiments, the coarse correction element 152 comprises a network of resistors 162 which can be configured to provide programmable impedance matching. In some embodiments, the coarse correction element 152 may comprise a set of programmable coarse impedance matching circuits 160 that are connected to each of the ports 124, 128 of the first set of ports 122 and the ports 128 of the second set of ports 126. Advantageously, the impedance values of the coarse correction element 152 may be dynamically controllable, configurable, and/or programmable, so as to match the characteristic impedances of the transmission lines (e.g., signal paths) in the system. The values of these impedances may differ (e.g., may be programmed differently) based on which particular signal path is activated (e.g., by the switching sub-circuit 140). Where the coarse correction element 152 comprises at least one impedance matching circuit, the granularities of the configurable impedance values may be configured based on the application of the particular system. In some embodiments, the impedance matching circuit of the coarse correction element 152 may include a real time controllable impedance control input for pre-programming and/or dynamically controlling the impedance matching circuit. In this manner, the impedance matching circuit 152 may, in certain embodiments, provide dynamically controllable variable impedance which can be pre-set for matching the impedance of the subsystem that drives the circuit 112.

In certain embodiments, the at least one fine correction element 154 of the correction circuit 150 further reduces signal reflections due to impedance mismatches and/or reduces other noise. In certain embodiments, for example, the coarse correction element 152 may be characterized as a first refining stage and the fine correction element 154 may be referred to as a second refining stage. The fine correction element 154 may smooth out the signal after it has undergone coarse correction (e.g., impedance matching) and reduces or removes transmission line characteristics from the received signal. Referring again to FIG. 4, the fine correction element 154 can be connected, for example, in parallel with the programmable coarse correction element 152. In some embodiments, the fine correction element 154 operates to reduce the impedance mismatches by introducing a current source that damps to the slew rate of the input signal, reducing signal reflection. The fine correction element 154 actively counteracts the noise in certain embodiments. In addition, the fine correction element 154 of certain embodiments is dynamically responsive to one or more changes in the noise, such as, for example, changes in the frequency of the noise component.

Figure 6:
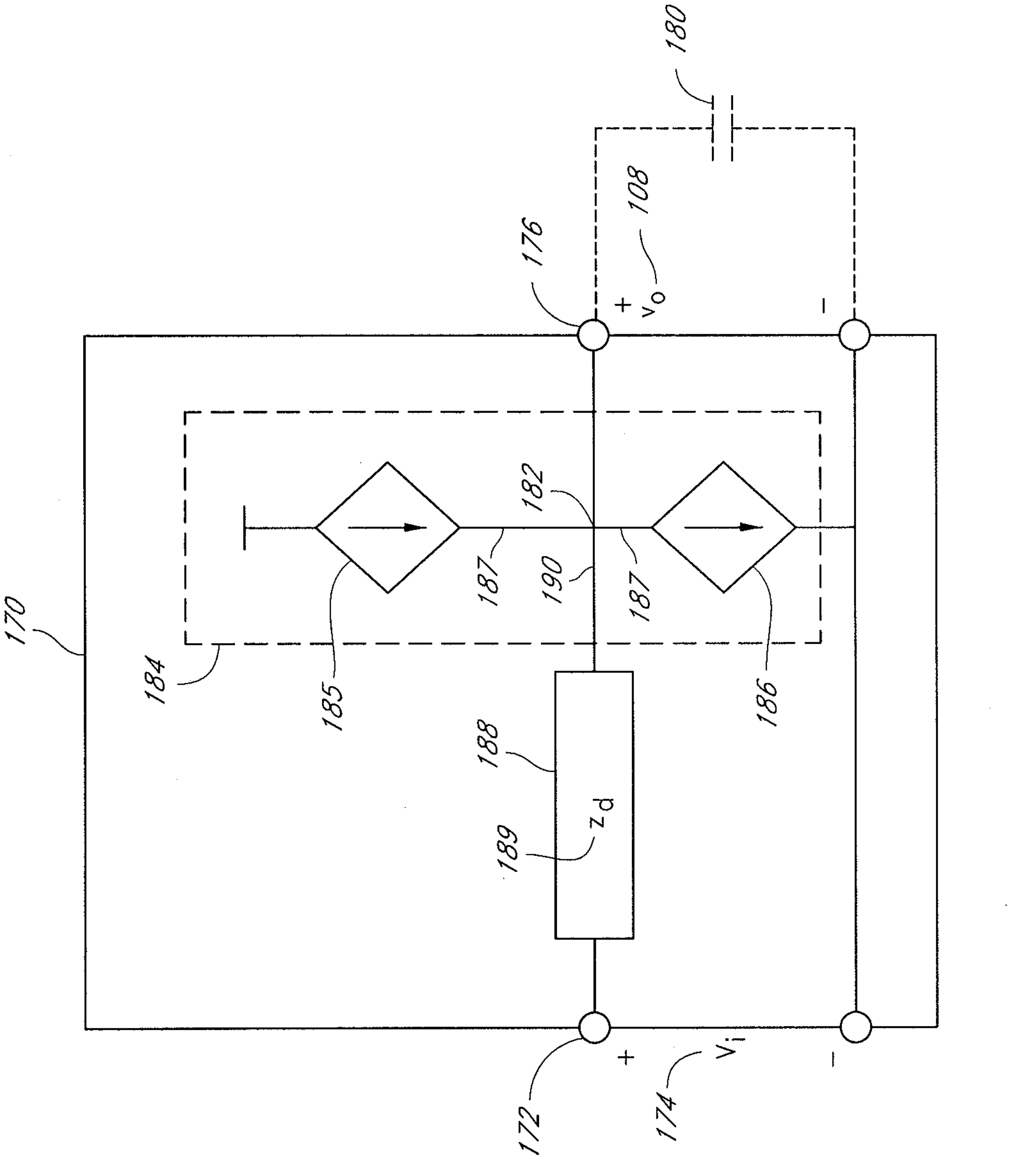
FIG. 6 schematically illustrates an example self-adjusting damper circuit in accordance with certain embodiments described herein.

The fine correction element 154 may include at least one damper circuit. The damper circuit includes at least one self-adjusting damper circuit 170 in certain embodiments, such as the example self-adjusting damper circuit 170 schematically illustrated by FIG. 6. In certain embodiments, the self-adjusting damper circuit 170 comprises an input terminal 172 adapted to receive an input signal 174 comprising an input noise component and an input signal component. The damper circuit 170 further comprises an output terminal 176. In certain embodiments, the damper circuit 170 includes a first sub-circuit 184 adapted to generate a first signal 187 responsive to at least a portion of the noise component. For example, the first sub-circuit 184 may generate the first signal 187 in response to the portion of the noise component not reduced by the coarse correction element 152 in certain embodiments. The damper circuit 170 of certain embodiments further comprises a second sub-circuit 188 adapted to generate a second signal 190 corresponding to a delayed version of at least a portion of the input signal. The damper circuit 170 combines the first signal 187 with the second signal 190 to generate an output signal 108 on the output terminal 176 wherein the output signal comprises an output noise component smaller than the input noise component. For example, the first signal 187 and the second signal 190 may be combined at the node 182 of the damper circuit 170. The output signal 176 of certain embodiments is substantially representative of the signal component of the input signal 174. The first sub-circuit 184 of certain embodiments comprises one or more current sources 185, 186. For example, the current sources 185, 186 may each comprise a controlled current source such as a voltage-controlled current source 185, 186 in certain embodiments. In some embodiments, the first sub-circuit 184 may comprise or be characterized as a negative feedback current source. In various embodiments, the self-adjusting damper circuit 170 includes an enable control input (not shown) for enabling the self-adjusting damper circuit 170. Examples of self-adjusting damper circuits 170 in accordance with certain embodiments described herein are described in U.S. Provisional Application No. 61/044,825, filed Apr. 14, 2008, and co-pending U.S. application Ser. No. 12/422,912, filed by the assignee of the present application on Apr. 13, 2009. Both applications are incorporated in their entirety by reference herein.

In certain embodiments, the at least one filter element 156 and the at least one repeater/amplifier element 158 may also reduce noise from other sources such as, for example, signal coupling (e.g., cross-coupling). The filter element 156 may reduce noise from the one or more signals where the noise includes a predetermined range of frequencies. For example, the filter element 156 may include at least one band-pass filter and may reduce any low and/or high frequency noise components. In other embodiments, the filter element 156 comprises at least one other type of a filter such as a notch filter, a low-pass filter, or a high-pass filter.

Figure 7:
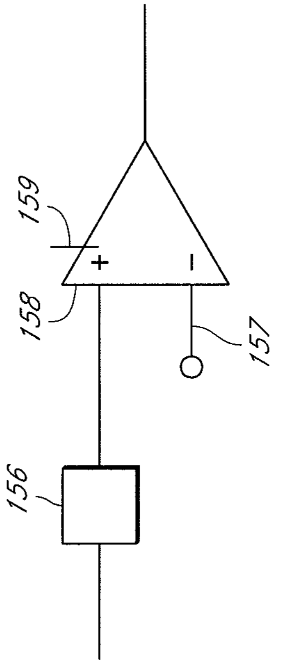
FIG. 7 schematically illustrates example configuration including an example filter element connected to an example repeater/amplifier in accordance with certain embodiments described herein.

One or more of the filter element 156 and the repeater/amplifier element 158 of certain embodiments enhance signal slew rate to reduce the transient power dissipation at target devices or components (e.g., one or more of the memory devices 110). FIG. 7 schematically illustrates example configuration including an example filter element 156 connected to an example repeater/amplifier element 158 in accordance with certain embodiments described herein. The repeater/amplifier element 158 includes an output enable control input 159 for controlling the bi-directional signal path. In various embodiments one or more of the filter element 156 and repeater/amplifier element 158 are programmable and/or dynamically controllable. The repeater/amplifier element may further include a reference input 157. In certain embodiments, the repeater/amplifier element 158 may include one or more operational amplifiers, for example. Referring again to FIG. 4, in certain embodiments, only filter element 156, only the repeater, only the amplifier, or any combination of the three elements may be included in the circuit.

The filter element 156 and/or the repeater/amplifier element 158 of certain embodiments provide wave reshaping functions and generally reduces signal noise. For example, the filter element 156 and/or the repeater/amplifier element 158 may reduce signal ringing due to reflection (e.g., reflections at one or more interfaces along the signal paths such as interfaces between the circuit 112, the connector 104, the memory devices 110 and/or the system board 109 of FIG. 3). In certain embodiments, the repeater/amplifier element 158 reshapes the signal which may be deteriorated due to transmission over lossy transmission lines having discontinuity regions. The repeater/amplifier element 158 may be configured to repeat the input signal, generating an output signal with earlier transition trigger points and faster slew rates in order to regain speed and to reduce the transient power.

In certain embodiments, the circuit 112 or portions thereof (e.g., the switching sub-circuit 140, the correction circuit 150 or elements thereof, etc.) is selected from a group consisting of: a programmable-logic device (PLD), an application-specific integrated circuit (ASIC), a field-programmable gate array (FPGA), a custom-designed semiconductor device, and a complex programmable-logic device (CPLD). For example, in certain embodiments, the circuit 112 or portions of thereof is implemented in one or more of a PLD, ASIC, FPGA, or CPLD. In other embodiments, the circuit 112 or portions thereof is implemented using some other technology, such as, for example, using discrete components.

In various embodiments, the elements of the circuit 112 such as the switching sub-circuit 140, the coarse correction element 152, the fine correction element 154, the filter element 156, and the repeater/amplifier element 158, comprise or may characterized as independent, fully controllable functional blocks. Additionally, in certain embodiments, any subset of one or more of these functional blocks may be implemented in order to enhance performance, reduce power dissipation, or provide other advantages.

Figure 8:
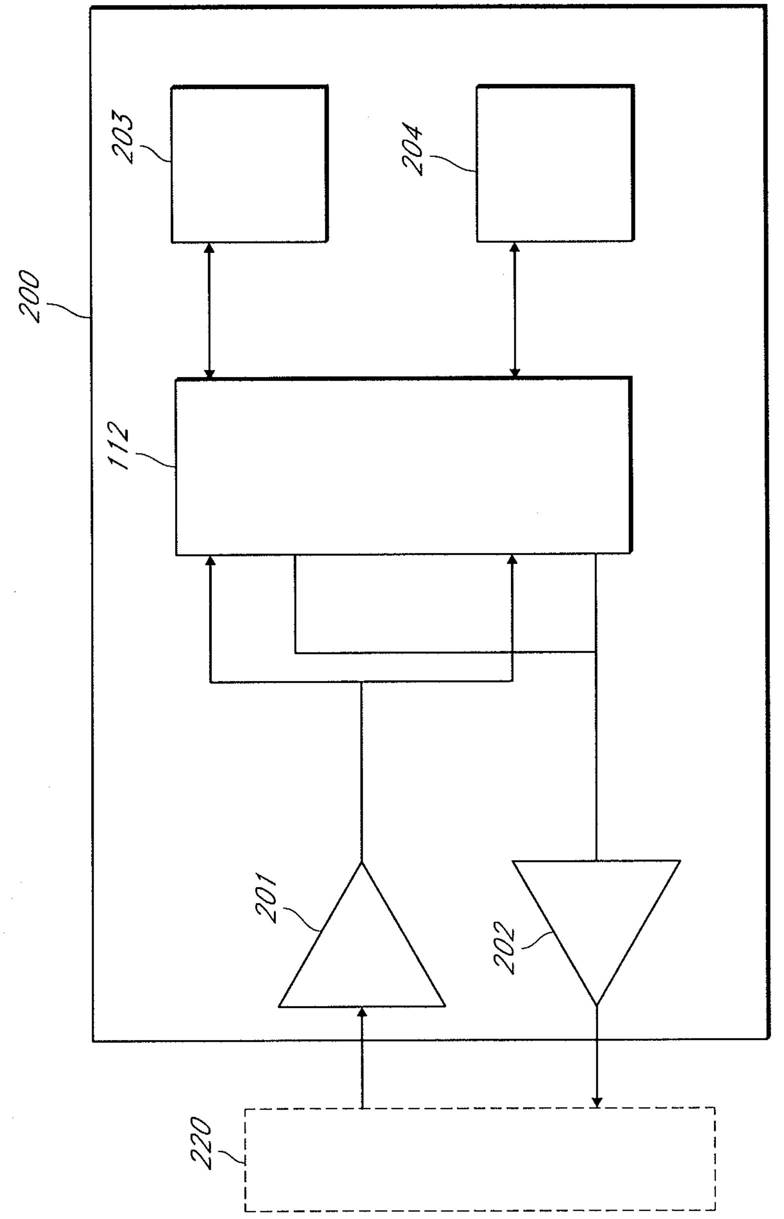
FIG. 8 schematically illustrates an example system having an example circuit connecting the system with one or more other systems in accordance with certain embodiments described herein.

FIG. 8 schematically illustrates an example system 200 having an example circuit 112 connecting a system 200 with one or more other systems 220 in accordance with certain embodiments described herein. The circuit 112 may be any of the circuits 112 discussed herein, such as the circuit 112 discussed above with respect to FIG. 8, for example. The system 200 of FIG. 8 includes a driver 202, a receiver 201, and two subsystems 203, 204. For illustration purposes, the system 200 of FIG. 8 is described as an open system that communicates with other systems 220 via the driver 202 and the receiver 201. Furthermore, in some embodiments, a connector (not shown) connects the system 200 with other systems by means of transmission lines. For example, the system 200 may be a memory system and the receiver 201 and the driver 202 of FIG. 8 may represent memory signals (e.g., data, address and/or control signals) transmitted between the system 220 (e.g., a memory controller and the subsystems 203, 204 (e.g., two sets of independently addressable memory devices such as DRAM devices). In certain embodiments, for example, the circuit 112 may be disposed on a memory board that is populated with sets of memory devices 203, 204.

In various embodiments, the receiver 201 may or may not contain any active circuits. For example, the receiver 201 may be a connector such as a socket or DIMM interface with a system board (e.g., the connector 104 described above in regards to FIG. 3). The output signal from the receiver 201 may exhibit the characteristics of the signal on a transmission line such as, for example, wave dispersion, attenuation, and reflection. In certain embodiments, the output signal from the receiver 201 goes through a number of refining, filtering and/or amplification stages in circuit 112 as described herein to improve the performance of the overall system. For example, the signal quality is enhanced by introducing at least one circuit 112 including at least one correction circuit 150 comprising one or more coarse correction elements 152 (e.g., impedance matching circuits), fine correction elements 154 (e.g., self-adjusting dampers), filter elements 156 (e.g., band-pass filters) and/or repeater/amplifier elements 158 as described herein on the signal paths (e.g., from receiver 101 to subsystem 103). For example, the circuit 112 may reduce power consumption by selectively isolating the inactive (or un-accessed) subsystems and may enhance the access rate of a targeted subsystem. For example, in one embodiment, the system 200 comprises a memory module 100 such as one of the memory modules described herein, the subsystems 203 and 204 comprise memory devices such as the memory devices 111 described herein, and the other system 220 comprises a host computer 108 including a memory controller 106 as described herein.

In certain embodiments, the performance is enhanced and power dissipation is reduced by removing the load associated with other (e.g., unused or inactive) subsystems (e.g., the subsystem 204) and reshaping the signal waveform using a filter element 156 and/or the repeater/amplifier element 158. In some embodiments, there are two refining stages for reducing signal reflections due to impedance mismatches. In some embodiments, for example, the first refining stage is the coarse correction element 152 (e.g., an impedance matching circuit) that matches the impedance of the transmission line (e.g., wire) prior to a receiver 101 with the characteristic impedance of the transmission line (e.g., wire) in the system 100. The second sate may be the fine correction element 154 (e.g., a self-adjusting damper for further reducing signal reflections due to impedance mismatches and/or reducing other noise.

Figure 9:
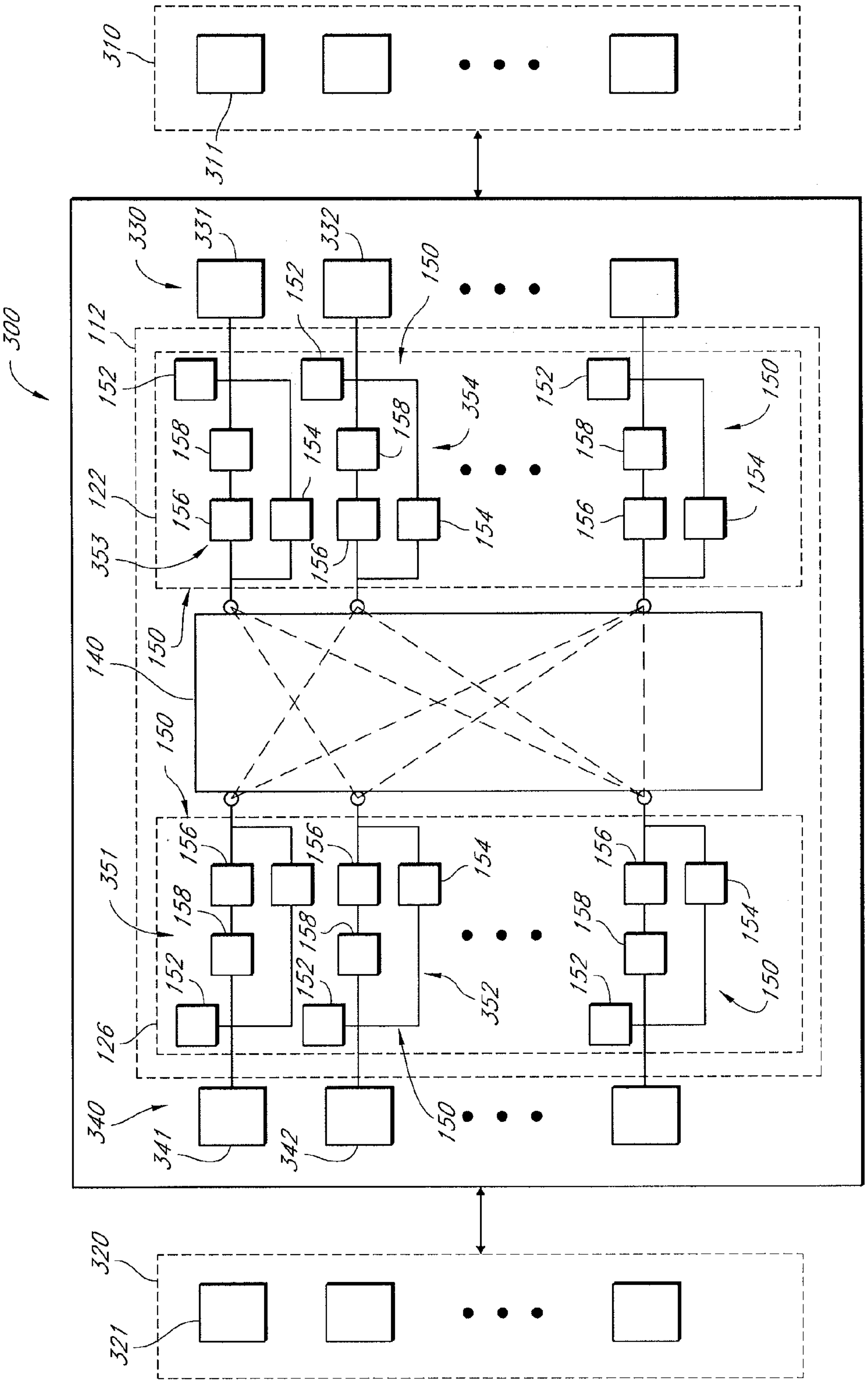
FIG. 9 schematically illustrates an example system including an example circuit in accordance with certain embodiments described herein.

FIG. 9 schematically illustrates an example system 300 including an example circuit 112 in accordance with certain embodiments described herein. The circuit 112 may be any of the circuits 112 discussed herein, such as the circuit 112 discussed above with respect to FIG. 3, for example. The circuit 112 comprises a first set of ports 122 comprising a plurality of bi-directional ports, each port of the first set of ports 122 configured to be operatively coupled to at least one subsystem 311 of a plurality of subsystems 310. The circuit 112 further comprises a second set of ports 126 comprising one or more bi-directional ports, each port of the second set of ports 126 configured to be operatively coupled to at least one subsystem 321 of one or more subsystems 320. In certain embodiments, the circuit 112 is configured to selectively operatively couple one or more ports of the second set of ports 126 to one or more ports of the first set of ports 122. In certain embodiments, the one or more ports of the first set of ports 122 and the one or more ports of the second set of ports 126 each comprises a correction circuit 150 which reduces noise in one or more signals transmitted between the one or more ports of the first set of ports 122 and the one or more ports of the second set of ports 126. The correction circuit 150 of certain embodiments may comprise one of the correction circuits 150 described herein such as the correction circuits 150 described above with respect to FIGS. 4-7 and may include at least one coarse correction element 152, at least one fine correction element 154, at least one filter element 156, and at least one repeater/amplifier element 158, or any combination or sub-combination thereof. In other embodiments, the fine correction element 154 may be placed after the switching sub-circuit 140 in order to achieve better results. For example, the fine correction element 154 may be connected after the filter element 156 (e.g., between the filter 156 and the repeater/amplifier element 158) in certain embodiments.

In certain embodiments, the system 300 includes a first set of interfaces 330 positioned between (e.g., logically and/or physically between) and operatively coupled to the first set of ports 122 and to the plurality of subsystems 310. In addition, the system 300 of certain embodiments may include a second set of interfaces 340 positioned between (e.g., logically and/or physically between) and operatively coupled to the second set of ports 126 and the one or more subsystems 320. For example, the first and/or second sets of interfaces 330, 340 may comprise port connections.

In an example configuration, the plurality of subsystems 310 include a plurality of memory devices 311 (e.g., DRAM devices) mounted on a memory module and the first set of interfaces 330 comprise interfaces between the circuit 112 and the plurality of memory devices 311. For example, each of the first set of ports 122 may correspond to a memory signal (e.g., a data, address, and/or control signal) and each of the first set of interfaces 330 is operatively coupled to a corresponding memory signal port of a corresponding memory device 311. The one or more subsystems 320 of the example configuration comprise a host computer system and the second set of interfaces 340 comprises memory board (e.g., a PCB of a memory module) interfaces to the host system. For example, the second set of interfaces 340 form part of a connector. Each of the second set of ports 126 and corresponding interfaces of the second set of interfaces 340 corresponds to a memory signal (e.g., a data, address, and/or control signal) of at least one memory bus between the host system and the memory module.

The coarse correction elements 152 (e.g., impedance matching circuits) and the fine correction elements (e.g., self-adjusting dampers) of the second set of ports 126 of the example configuration are configured to reduce the signal reflection due to the impedance mismatching between the system board and the memory board. The coarse correction elements 152 (e.g., impedance matching circuits) and the fine correction elements (e.g., self-adjusting dampers) of the second set of ports 122 of the example configuration are configured to reduce the signal reflection due to the impedance mismatching between the circuit 112, the memory board and/or the plurality of memory devices. The filter elements 156 (e.g., a bandpass filter) reduce or filter out cross-coupling between signals, for example. For example, the filter elements 158 reduce or filter out cross-coupling between data, address, and/or control signals (e.g., wires).

Figure 10:
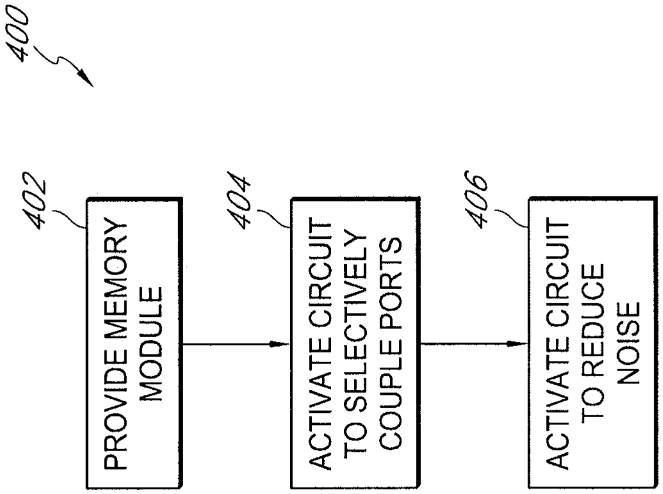
FIG. 10 is a flowchart of an example method 400 of using a memory module with a computer system in accordance with certain embodiments described herein.

FIG. 10 is a flowchart of an example method 400 of using a memory module 100 with a computer system in accordance with certain embodiments described herein. While the method 400 is described herein by reference to the memory module 100 schematically illustrated by FIG. 3, other memory modules, electronic systems or subsystems, and/or circuits are also compatible with the embodiments described herein. In certain embodiments, at operational block 402, the method 400 comprises providing a memory module 100 comprising a printed circuit board 102 having at least one connector 104 configured to be operatively coupled to a memory controller 106 of a computer system 108 and to a plurality of memory devices 110. The memory module 100 further comprises a circuit 112 including a first set of ports 122 comprising a plurality of bi-directional ports 124. In certain embodiments, each port 124 of the first set of ports 122 is operatively coupled to at least one memory device 111 of the plurality of memory devices 110. The circuit of certain embodiments further includes a second set of ports 126 comprising one or more bi-directional ports 128 where each port 128 of the second set of ports 126 is operatively coupled to the at least one connector 104.

The circuit 112 of certain embodiments is configured to selectively operatively couple one or more ports 128 of the second set of ports 126 to one or more ports 124 of the first set of ports 122. The one or more ports 124 of the first set of ports 122 and the one or more ports 128 of the second set of ports 126 each comprises at least one correction circuit 150 which reduces noise in one or more signals transmitted between the one or more ports 124 of the first set of ports 122 and the one or more ports 128 of the second set of ports 126.

The method 400 of certain embodiments further includes activating the circuit 112 at operational block 404 to selectively operatively couple at least one of the one or more ports 128 of the second set of ports 126 to at least one of the one or more ports 124 of the first set of ports 122. For example, in certain embodiments, activating the circuit 112 to perform the selective operative coupling may include sending the appropriate control signal or combination of control signals to a switching sub-circuit 140 of the circuit 112. In certain embodiments, the method 400 further includes activating the circuit 112 to reduce noise in the one or more signals at operational block 406. For example, in one embodiment, activating the circuit 112 to reduce noise comprises activating one or more of the elements of the correction circuit 150 (e.g., at least one coarse correction element 152, at least one fine correction element 154, at least one filter element 156, and at least one repeater/amplifier element 158) of ports 124, 128 of the first and second sets of ports 122, 126 corresponding to active signal paths between the memory controller 106 and the memory devices 110. Activating one or more of the elements 152, 154, 156, 158 of the correction circuit 150 may include sending control signals (e.g., enable signals) to the appropriate elements 152, 154, 156, 158 and/or receiving the control signals (e.g., enable signals) at the appropriate elements 152, 154, 156, 158.

The operational blocks 402, 404, 406 of the method 400 may be performed in a different order than provided or one or more of the operational blocks may be performed substantially at the same time or during overlapping time periods. For example, in certain embodiments, at least the operational block 404 and the operational block 406 are performed substantially simultaneously. In addition, in some embodiments, one or more of the operational blocks 402, 404, 406 may not be included, an additional operational block may be included, or both. The devices and methods described herein may be incorporated in any system (e.g. a board level system) or device that contains one or more connectors or wires.

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A memory module operable to communicate signals with a system memory controller, comprising:

a printed circuit board comprising at least one connector configured to be operatively coupled to the system memory controller;

a plurality of memory devices on the printed circuit board;

a circuit, comprising:

a first set of ports comprising a plurality of bi-directional ports, each port of the first set of ports operatively coupled to at least one memory device of the plurality of memory devices; and a second set of ports comprising one or more bi-directional ports, each port of the second set of ports operatively coupled to the at least one connector; and a switching circuit configured to selectively and operatively couple one or more ports of the second set of ports to one or more selected ports of the first set of ports, the one or more selected ports being operatively coupled to one or more first memory devices that are being accessed by the system memory controller, wherein the switching circuit is further configured to reshape signals between the system memory controller and the one or more first memory devices so as to ameliorate signal deterioration due to transmission over lossy transmission lines having discontinuity regions between the system memory controller and the one or more first memory devices.

2. The memory module of claim 1, wherein the switching circuit is further configured to and to selectively isolate one or more un-driven ports of the first set of ports from the second set of ports provide a known static value to the un-driven ports, thereby reducing dynamic power consumption associated with floating or toggling electrical nodes.

3. The memory module of claim 1, wherein the switching circuit comprises a plurality of circuits each corresponding to a subset of the plurality of devices and each having a data width that is a fraction of a data width of the memory module, the fraction being selected to optimize interconnection characteristics selected from the group consisting of timing, power consumption and signal integrity between the switching circuit and the plurality of memory devices.

4. The memory module of claim 1, further comprising a local memory controller to control the selective and operative coupling and the selective isolating in the switching circuit based on control signals from the system memory controller.

5. The memory module of claim 1, wherein the switching circuit establishes a one-to-one signal path for transferring data from each port of the second set of ports to a selected corresponding port of the first set of ports.

6. The memory module of claim 1, wherein the switching circuit establishes a one-to-many connection for broadcasting data from each port of the second set of ports to selected corresponding ports of the first set of ports.

7. The memory module of claim 1, wherein the switching circuit includes at least one router circuit and at least one signal correction circuit for each of a plurality of signal paths between the system memory controller and the plurality of memory devices, the at least one signal correction circuit including a repeater/amplifier element that can be enabled to generate a respective output signal for a respective input signal, the respective output signal having an earlier transition trigger point and a faster slew rate than the respective input signal.

8. The memory module of claim 7, wherein the at least one router circuit can be enabled to operatively couple a corresponding one of the first set of ports to a corresponding one of the second set of ports or disabled to isolate the corresponding one of the first set of ports from the corresponding one of the second set of ports.

9. The memory module of claim 7, wherein the at least one signal correction circuit further includes a filter, a programmable impedance matching circuit and a self-adjusting damper circuit.

10. The memory module of claim 9, wherein the programmable impedance matching circuit includes a network of programmable resisters that are dynamically controllable to match a characteristic impedance of a corresponding signal path.

11. The memory module of claim 9, wherein the self-adjusting damper circuit includes an input terminal adapted to receive an input signal comprising an input noise component and an input signal component, a first sub-circuit adapted to generate a first signal responsive to at least a portion of the noise component, and a second sub-circuit adapted to generate a second signal corresponding to a delayed version of at least a portion of the input signal, the self-adjusting damper circuit combining the first signal with the second signal to generate an output signal.

12. A method of operating a memory module to communicate signals with a system memory controller via a plurality of signal transmission lines, the memory module including a plurality of memory devices on a module board, the module board including at least one connector configured to be operatively coupled to the plurality of signal transmission lines, the method comprising:

selectively and operatively coupling one or more ports of a second set of ports to one or more selected ports of a first set of ports, the first set of ports comprising a plurality of bi-directional ports, each port of the first set of ports operatively coupled to at least one memory device of the plurality of memory devices, the one or more selected ports being operatively coupled to one or more first memory devices that are being accessed by the system memory controller, the second set of ports comprising one or more bi-directional ports, each port of the second set of ports operatively coupled to the at least one connector; and reshaping signals between the memory controller and the one or more first memory devices so as to ameliorate signal deterioration due to transmission over lossy transmission lines having discontinuity regions between the system memory controller and the one or more first memory devices.

13. The method of claim 12, further comprising:

selectively isolating one or more un-driven ports of the first set of ports from the second set of ports, and the one or more un-driven ports being operatively coupled to one or more second memory devices that are not being accessed by the system memory controller; and providing a known static value to the un-driven ports, thereby reducing dynamic power consumption associated with floating or toggling electrical nodes.

14. The method of claim 12, wherein reshaping the input signals to generate reshaped signals comprises generating a respective output signal for a respective input signal, the respective output signal having an earlier transition trigger point and a faster slew rate than the respective input signal.

15. The method of claim 12, further comprising dynamically controlling a network of programmable resisters associated with each active signal path between the system memory controller and the plurality of memory devices so as to match a characteristic impedance of the each active signal path.

16. The method of claim 12, wherein each input signal comprises an input noise component and an input signal component, the method further comprising, for each input signal:

generating a first signal responsive to at least a portion of the noise component and a second signal corresponding to a delayed version of at least a portion of the input signal; and combining the first signal with the second signal to generate an output signal.

17. The method of claim 12, further comprising controlling the selective and operative coupling and the selective isolating in the switching circuit based on control signals from the system memory controller.

18. A memory module operable to communicate signals with a system memory controller via a memory bus, comprising:

a printed circuit board comprising at least one connector configured to be operatively coupled to the memory bus;

a plurality of memory devices on the printed circuit board;

a circuit, comprising:

a first set of ports comprising a plurality of bi-directional ports, each port of the first set of ports operatively coupled to at least one memory device of the plurality of memory devices;

a second set of ports comprising one or more bi-directional ports, each port of the second set of ports operatively coupled to the at least one connector; and a switching circuit configured to selectively and operatively couple one or more ports of the second set of ports to one or more selected ports of the first set of ports and to selectively isolate one or more un-driven ports of the first set of ports from the second set of ports, the one or more selected ports being operatively coupled to one or more first memory devices that are being accessed by the system memory controller, and the one or more un-driven ports being operatively coupled to one or more second memory devices that are not being accessed by the system memory controller, wherein the switching circuit is further configured to reshape signals communicated between the system memory controller and the one or more first memory devices via the selected ports and to provide a known static value to the un-driven ports, thereby ameliorating signal deterioration due to transmission over lossy transmission lines having discontinuity regions and reducing dynamic power consumption associated with floating or toggling electrical nodes.

19. The memory module of claim 18, wherein the switching circuit provides one or more signal paths between the one or more ports of the second set of ports and the one or more selected ports of the first set of ports, wherein the switching circuit includes at least one signal correction circuit for each of the one or more signal paths, the at least one signal correction circuit including a repeater/amplifier element that can be enabled to generate a respective output signal for a respective input signal, the respective output signal having an earlier transition trigger point and a faster slew rate than the respective input signal.

20. The memory module of claim 18, wherein the switching circuit includes at least one programmable impedance matching circuit for each of a plurality of signal paths between the system memory controller and the plurality of memory devices, the programmable impedance matching circuit having a network of programmable resisters that are dynamically controllable to match a characteristic impedance of a corresponding signal path.

* * * * *